United States Patent
Hiebert et al.

(10) Patent No.: US 9,356,608 B1
(45) Date of Patent: May 31, 2016

(54) METHOD AND APPARATUS FOR CONTROLLING MISMATCH IN A VOLTAGE CONTROLLED OSCILLATOR ARRAY

(71) Applicant: PMC-SIERRA US, INC., Sunnyvale, CA (US)

(72) Inventors: Mark Hiebert, New Westminster (CA); Srinivasa Rao Madala, Chimakurthy (IN); Hormoz Djahanshahi, Port Moody (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 0 days.

(21) Appl. No.: 14/696,113

(22) Filed: Apr. 24, 2015

Related U.S. Application Data

(60) Provisional application No. 61/985,840, filed on Apr. 29, 2014.

(51) Int. Cl.
- H03B 25/00 (2006.01)
- H03L 7/06 (2006.01)
- H03B 5/12 (2006.01)

(52) U.S. Cl.
CPC ........ *H03L 7/06* (2013.01); *H03B 5/124* (2013.01); *H03B 5/1256* (2013.01)

(58) Field of Classification Search
CPC .................................................. H03B 25/00
USPC ................................................. 331/47, 2, 56
See application file for complete search history.

(56) References Cited

U.S. PATENT DOCUMENTS

| | | | | |
|---|---|---|---|---|
| 6,937,107 B2 * | 8/2005 | Ravi | ........... | H03B 27/00 331/47 |
| 6,960,963 B2 | 11/2005 | Kim | | |
| 7,295,076 B2 | 11/2007 | Kim et al. | | |
| 7,863,987 B2 * | 1/2011 | Kanda | ........... | G06F 1/04 331/117 R |
| 7,952,439 B1 | 5/2011 | Heggemeier et al. | | |
| 8,410,858 B2 | 4/2013 | Wood | | |
| 8,981,854 B2 * | 3/2015 | Tomita | ........... | H03L 7/18 327/144 |
| 2013/0300470 A1 | 11/2013 | Mohajeri et al. | | |

OTHER PUBLICATIONS

Romano, Luca et al., "5-GHz Oscillator Array With Reduced Flicker Up-Conversion in 0.13-μm CMOS", IEEE Journal of Solid-State Circuits, vol. 41, No. 11, Nov. 2006, pp. 2457-2467.

Deng, Zhiming et al., "A 4-Port-Inductor-Based VCO Coupling Method for Phase Noise Reduction", IEEE Journal of Solid-State Circuits, vol. 46, No. 8, Aug. 2011, pp. 1772-1781.

Deng, Zhiming et al., "A 4-Port-Inductor-Based VCO Coupling Method for Phase Noise Reduction", IEEE Journal of Solid-State Circuits, 2011, Custom Integrated Circuits Conference (CICC), Sep. 19-22, 2010, pp. 1-4.

(Continued)

*Primary Examiner* — Joseph Chang
(74) *Attorney, Agent, or Firm* — Dennis R. Haszko

(57) ABSTRACT

A method and system are provided for reducing mismatch between oscillators in an LC VCO array. In an implementation, a method comprises measuring the mismatch between the driver strengths, by measuring the corresponding oscillation amplitudes, and a mismatch between the resonance frequency of each LC VCO in the array of VCOs, and adjusting each LC VCO to reduce the measured amplitude and frequency mismatches. In an implementation, the measuring and adjusting is performed once to calibrate the array of VCOs. In another implementation, the system measures and adjusts the array of VCOs repeatedly. In another implementation, the LC VCO array has a master VCO and a plurality of slave VCOs connected to the master VCO by slave PLLs to reduce phase noise caused by mismatches.

11 Claims, 15 Drawing Sheets

(56) References Cited

OTHER PUBLICATIONS

Mellouli, Dorra et al., "Design and Implementation of a 6-GHz Array of Four Differential VCOs Coupled Through a Resistive Network", Analog Integrated Circuits and Signal Processing, vol. 76, Issue 2, Jun. 16, 2013, pp. 179-193.

Shirinfar, Farid et al., "A Multichannel, Multicore mm-Wave Clustered VCO with Phase Noise, Tuning Range, and Lifetime Reliability Enhancements", Radio Frequency Integrated Circuits Symposium (RFIC), 2013 IEEE, Jun. 2-4, 2013, pp. 235-238.

\* cited by examiner

METHOD AND APPARATUS FOR CONTROLLING MISMATCH IN A VOLTAGE CONTROLLED OSCILLATOR ARRAY

FIELD

The present disclosure relates to voltage controlled oscillators (VCOs), including but not limited to an array of VCO instances.

BACKGROUND

In many Radio Frequency (RF) applications, the Phase Noise of a Local Oscillator (LO) clock source is a key concern in designing the system. For example, in a typical Quadrature RF Receiver, the RF signal is received by an antenna, amplified by a Low-Noise Amplifier (LNA), and then down-converted from RF to an Intermediate Frequency (IF) or Baseband (BB, sometimes also known as "Zero-IF" or ZIF) by mixing the output from the LNA with two versions of a Local Oscillator clock source using two mixers. One copy of the LO clock source is shifted by a quarter phase. The outputs from the mixers are then filtered by two Low-Pass Filters (LPFs) for further processing. A Quadrature RF Transmitter is qualitatively similar, but operates in reverse, with two BB/IF signals being up-converted to RF using two mixers, summed together, and finally amplified by a Power Amplifier (PA) for transmission over the antenna.

RF systems can take various forms, and the details of their construction are beyond the scope of this document, however almost all structures involve mixing signals with LO clock sources to convert BB/IF signals to RF or vice versa. There are many possible mixer structures, and the details of their construction are also beyond the scope of this document, however at their core they can all be modeled as analog multipliers. Applying two sinusoidal inputs to an analog multiplier:

$$i_1 = \cos(2\cdot\pi\cdot f_1 \cdot t), i_2 = \cos(2\cdot\pi\cdot f_2 \cdot t) \quad \text{(Equation 1)}$$

Results in:

$$i_1 \cdot i_2 = \cos(2\cdot\pi\cdot f_1\cdot t)\cdot\cos(2\cdot\pi\cdot f_2\cdot t) = \frac{1}{2}\cdot(\cos(2\cdot\pi\cdot(f_1+f_2)\cdot t) + \cos(2\cdot\pi\cdot(f_1-f_2)\cdot t)) \quad \text{(Equation 2)}$$

In other words, the act of multiplying two pure sinusoids results in two other sinusoids, one at the "sum" frequency (i.e. $f_1+f_2$), the other at the "difference" frequency (i.e. $f_1-f_2$). In many RF applications, typically one of these two frequencies is desired while the other (known as the "image") is not and is rejected at the output, using a Low-Pass Filter, trigonometric identities or some other means.

FIGS. 1A and 1B respectively show the Power Spectral Density (PSD) of one possible frequency plan for a single-frequency Receive RF system, and the effect of LO Phase Noise at the output. Before the mixer, as shown in FIG. 1A, an LO clock source 101 and a desired RF signal 111 are present. After the mixer, as shown in FIG. 1B, there are two signals, the desired "difference" signal 113 at IF and the undesired "sum" signal 114 at a much higher "image" frequency, (which would typically be removed with a Low-Pass Filter). The effects of phase noise on the LO clock source 102 are also shown, and result in spectral growth 115 and 116 of the RF signal at the mixer output. The LO Clock Source Phase Noise 102, when looked at on a PSD plot as in FIG. 1A, is all power present in the LO signal that is not in the pure tone at the desired frequency, and is usually expressed in the units dBc/Hz, i.e. the amount of power present in 1 Hz of bandwidth relative to the power of the LO tone.

In broadband applications such as telecommunication, Phase Noise is often expressed using terms such as Integrated RMS Jitter or Total Jitter, often measured in femtoseconds (fs) or picoseconds (ps). However in RF applications it is often more appropriate to talk about Phase Noise in dBc/Hz at certain frequency offsets, for example "−153 dBc/Hz at 800 kHz offset". To understand why, FIG. 1C shows a frequency plan for a multi-carrier RF Receiver, where the desired signal 111 is present but at a much lower power than a second signal 121 (also known as a "Blocker") in an adjacent carrier frequency. As before, after the mixer, as shown in FIG. 1D, the two output signals 113 and 114 from the desired RF channel are present, as are the two output signals 123 and 124 from the Blocker.

As before, Phase Noise 102 on the LO Clock Source results in spectral regrowth, however in the multi-carrier scenario the spectral regrowth 125 and 126 from the high-power blocker 121 appears in the IF band of the down-converted signal 113. Because it is impossible to remove this noise from the IF signal, this irreparably harms the Signal-to-Noise Ratio (SNR) of the down-converted signal, hence limiting the available information-carrying bandwidth of the RF Receiver in that channel. The spectral regrowth 115 of a single-carrier system is typically much less disruptive than the regrowth 125 in a multi-carrier system because the regrowth power in a single-carrier system is proportional to the signal power, whereas in multi-carrier system the regrowth power is proportional to the blocker's signal power, which depending upon a number of factors can be much higher.

Because multi-carrier RF Transmit systems are usually dealing with multiple RF signals of similar power, spectral regrowth concerns due to LO Phase Noise is often less of an issue than in multi-carrier RF Receive systems, but still should be considered.

Voltage controlled oscillators (VCOs) are electronic oscillators used in a number of electronic circuits. A VCO has a voltage input that controls the oscillation frequency. An LC VCO, is a VCO that includes a frequency-selective resonance tank made up of an inductor and a capacitor. In designing a low phase noise LC VCO, driver size can be reduced in order to improve driver signal-to-noise ratio (SNR). In many cases, driver noise dominates the phase noise. There is great deal of information known to those skilled in the art about minimizing LC VCO phase noise in general, and it is beyond the scope of this document to discuss this in great detail. However, without wishing to be bound by theory, the following discussion may be useful in illustrating some performance limits of LC VCOs in an Integrated Circuit (IC) environment.

An elementary Inductance/Capacitance Voltage-Controlled Oscillator (LC VCO) 200 is shown in FIG. 2A, and consists of a driver 204, an inductor 201, a fixed capacitor 203, and a voltage-tunable variable capacitor, or varactor 202, the capacitance of which is determined by the input Control Voltage. The driver 204 has a transconductance gain $g_m$ and provides sufficient gain in the loop to overcome the losses in the non-ideal inductance and capacitance elements and interconnections to ensure that the criteria for generating oscillations, known as Barkhausen criteria, are met. The inductor 201 and fixed capacitor 203 approximately set the natural resonant frequency of the VCO. By tuning the control voltage of the varactor 202 the frequency of the VCO can be fine-tuned; for example a phase-locked loop (PLL) circuit can be constructed to lock the VCO's output signal frequency and phase to the frequency and phase of a higher level input reference clock signal. The VCO 200 of FIG. 2A is relatively simple because it deploys a single resonant tank and a fixed driver element. Numerous techniques to minimize harmonic folding of noise contributors and to calibrate the driver strength to minimize the noise contribution of the driver are known to those skilled in the art.

The LC VCO 200 of FIG. 2A is one of the simplest possible configurations. However, it is useful to illustrate the performance limitations that are faced in an LC VCO that is implemented in a typical modern IC fabrication process. FIG. 2B shows a parallel RLC model 210 of the LC VCO of FIG. 2A. Inductance L and capacitance C set the oscillation frequency $f_0$, while the shunt resistance R represents losses and determines the quality factor (Q factor, or Q) and oscillation swing (amplitude). According to equations 3-6:

$$\omega_0 = 2\pi f_0 = \frac{1}{\sqrt{LC}} \quad \text{(Equation 3)}$$

$$Q = \frac{R}{L\omega_0} = RC\omega_0 \quad \text{(Equation 4)}$$

$$v(t) = V_0 \cos(\omega_0 t) = RI_0 \cos(\omega_0 t) \quad \text{(Equation 5)}$$

$$P_{sig} = \frac{V_0^2}{2R} = \frac{RI_0^2}{2} \quad \text{(Equation 6)}$$

where $\omega_0$ and $f_0$ are oscillation frequency in radian/s and Hz, respectively, $V_0$ is the peak of sinusoidal voltage oscillation across the tank, $I_0$ is the peak of sinusoidal current out of the oscillator driver onto the tank, and $P_{sig}$ is the RMS power of the oscillation signal. In practice, to achieve the best phase noise performance, the oscillator needs to operate at the boundary of the voltage-limited regime and the current-limited regime where oscillation across the LC tank swings close to its maximal value $V_{0,max}$ while still remaining sinusoidal (without hard clipping).

Equation 7 shows the basic term of Leeson's equation that describes the power spectral density of an oscillator's phase noise due to thermal noise sources at offset $\Delta f$ from carrier frequency $f_0$, $$L(\Delta f) = 10 \log_{10} \left[ \frac{2kT}{P_{stg}} \left( \frac{1}{2Q} \frac{f_0}{\Delta f} \right)^2 \right] \quad \text{(Equation 7)}$$

where k is Boltzmann's constant, T is absolute temperature in Kelvins, Q is loaded quality factor of the tank, and $L(\Delta f)$ is single-side-band (SSB) phase noise profile in dBc/Hz. The phase noise profile in this equation exhibits a slope of −6 dB/octave, or −20 dB/decade, vs. $\Delta f$ and describes thermal noise region (a.k.a.

$$\frac{1}{f^2}$$

region) of the oscillator up to the resonance bandwidth of $$\frac{f_0}{2Q}.$$

Leeson's equation suggests that to improve phase noise, one would need to increase Q and/or the oscillation power $P_{sig}$. Equation 7 applies only between flicker noise corner (i.e., corner of $$\frac{1}{f^3}$$

and $$\frac{1}{f^2}$$

regions) and $$\frac{f_0}{2Q},$$

above which a flat noise floor dominates. The equation was further modified by D. B. Leeson to account for several experimentally observed phenomena, including $$\frac{1}{f^3}$$

region and the flat noise floor region; nonetheless, the observations about increasing Q and the oscillation power $P_{sig}$ to improve the phase noise remain the same.

The first aspect to note here is that the phase noise performance that is achievable is limited by the quality factor Q, or in other words dissipative losses of the VCO's LC resonant tank, and there is a practical limit to the values of Q that are achievable in an integrated circuit (IC) LC tank. Generally speaking, in an integrated VCO the inductor is a dominant factor in limiting the tank Q factor, and the inductor Q can typically be maximized through minimizing the inductor value down to a certain practical limit. Therefore, in an integrated VCO design, one would first realize an inductor that maximizes Q at the desired frequency of oscillation.

For a given oscillation frequency, the phase noise of an LC oscillator can be improved by ($10 \times \log_{10} N$) in decibel units (dB) by decreasing the inductance (L) by N times and increasing the capacitance (C) by N times and consuming more power by N times. If the RLC tank's impedance is scaled by 1/N, the values of R, L and C are replaced by R/N, L/N and NC, respectively. In this case, according to equations 3-4, the oscillation frequency and quality factor remain intact. Moreover, based on equations 5-6, to maintain the desired maximal signal swing $V_{0,max}$, the oscillator driver output current would need to scale up from $I_0$ to $NI_0$ (e.g., by implementing N identical drivers in parallel), which implies the signal power is increased from $P_{sig}$ to $NP_{sig}$. If the impedance scaling is applied on individual lumped components, in the limit of this approach, the physical shape of a very small inductor becomes very hard to model and predict accurately prior to fabrication. Also, pushing the scaled-up current of $NI_0$ through a single inductor can eventually exceed electro-migration (EM) limits of metal traces and cause reliability and thermal issues.

In essence, the LC tank's Q factor can be improved up to a limit, but at some point the inductance and the Q factor become too challenging to model and predict, and other implementation issues will arise. LC tanks need to be predictable to minimize costly revisions of integrated circuit designs and to enable designers to re-center existing VCO designs to nearby frequencies for alternative applications with high confidence. The performance limitations are experienced when the physical characteristics of the inductor are at the threshold of being practically impossible to model with sufficient accuracy.

Another approach to the impedance scaling is to implement N resonance RLC tanks in parallel. This approach, known as multi-core VCO, or array VCO, can provide further oscillator phase noise improvement. Placing inductors in parallel effectively reduces total inductance and improves phase noise, without requiring unreliably low individual inductances. Such a configuration is useful when a modeling limit or parasitics limit is reached in the design of an individual LC VCO.

For example, FIG. 3 shows an example array 300 of multiple LC VCOs 301, 302, 303 connected to provide the outputs of individual LC VCOs to an averaging circuit 304 so that the output signal from the averaging circuit 304, which is the average of the individual outputs of the first to Nth VCO elements 301, 302, 303 in the array 300, can be used as the overall oscillator output signal. Because the noise of each array element is uncorrelated from the others but the signals of the VCO elements in the array can be correlated, the SNR of the average output signal of the array of VCO elements can be higher than the SNR of an individual VCO element's signal, hence the phase noise can be improved in the VCO array.

While the array elements may be designed to have same characteristics, in any real device the individual elements will generally not have completely identical characteristics, as discussed further below. FIG. 4A illustrates a known LC VCO array with matched circuits, and FIG. 4B illustrates a known LC VCO array with mismatched circuits. If VCO elements are matched, ideally no current flows through interconnects between LC tanks. However, mismatched LC VCO characteristics will cause current to flow through interconnects of the array, as shown in FIGS. 4A and 4B. Such currents cause power dissipation and degrade phase noise, which is undesirable. For example, current flowing through an interconnect degrades phase noise, because the interconnect between large physical LC VCO structures will be resistive. The impedance of the interconnect and the magnitude of mismatch between VCOs introduces a practical limit to VCO array size.

Current state of the art of design techniques used in building an array of LC VCOs to generate high performance clock signals in an integrated circuit is represented by the following public domain publications, incorporated by reference in their entirety:

US Patent Application Publication No. US2013/300470 to Mohajeri, entitled Low Jitter Clock Generator for Multiple Lanes High Speed Data Transmitter;

Luca Romano, Andrea Bonfanti et al., *IEEE Journal of Solid-State Circuits*, November 2006: *5-GHz Oscillator Array With Reduced Flicker Up-Conversion in 0.13-μm CMOS;*

Dorra Mellouli, David Cordeau et al., *Springer-Analog Integrated Circuits and Signal Processing*, August 2013: *Design and Implementation of A 6-GHz Array of Four Differential VCOs Coupled Through a Resistive Network;*

Zhiming Deng and Ali M. Niknejad, *IEEE Journal of Solid-State Circuits*, August 2011: *A 4-Port-Inductor-Based VCO Coupling Phase Noise Reduction.*

The inventors have determined that improvements in matching of VCOs and their control are desirable.

BRIEF DESCRIPTION OF THE DRAWINGS

Embodiments of the present disclosure will now be described, by way of example only, with reference to the attached Figures.

DETAILED DESCRIPTION

Figure 1A:
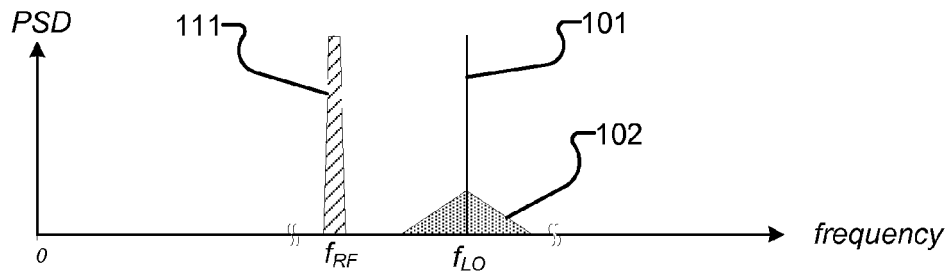
FIG. 1A is a power spectral density (PSD) graph showing an RF signal of interest and a local oscillator (LO) signal with phase noise skirts before mixing.
Figure 1B:
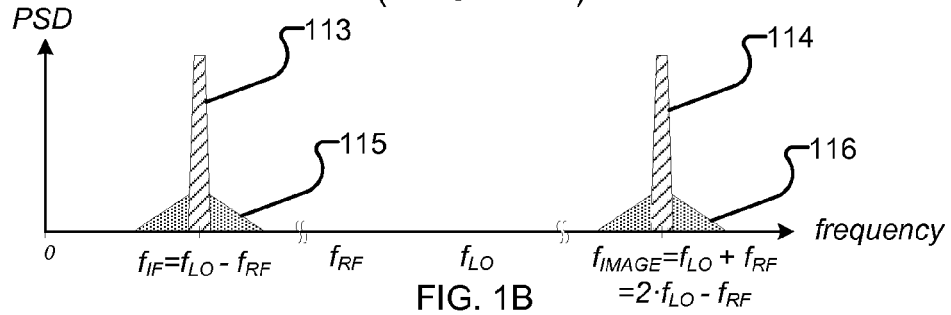
FIG. 1B is a PSD graph showing the signals of FIG. 1A after mixing.
Figure 1C:
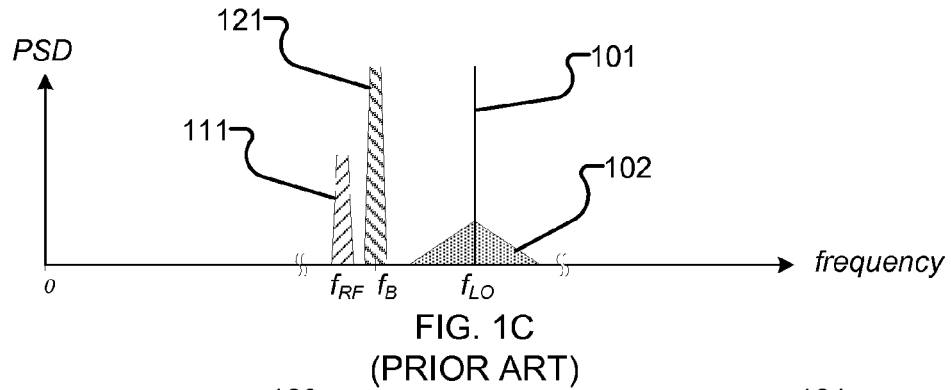
FIG. 1C is a PSD graph showing a multi-carrier RF system with a signal of interest, a larger blocker signal, and a LO signal with phase noise skirts before mixing.
Figure 1D:
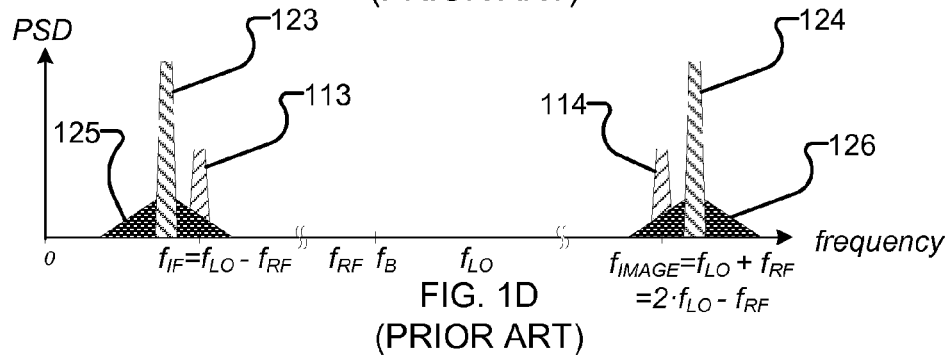
FIG. 1D is a PSD graph showing the signals of FIG. 1C after mixing.

In some high performance VCO applications (such as, for example RF, or high speed SERDES for Telecommunication standards), it is not possible to achieve the necessary oscillator quality inside an IC with state of the art single-core LC VCO techniques using on-die inductors. Known implementations require external VCO modules, which have an associated large size and high cost. The known integrated techniques used to approach high performance VCO levels are difficult and risky. They include complex LC VCO driver circuit topologies, and inductor implementations that are difficult to model, which results in risky design implementations.

Known LC VCO array implementations have associated problems or undesirable characteristics. Building an array of VCOs large enough requires extreme care for matching and balancing, which can involve significant additional area and can limit the practical size of the VCO array or limit the VCO performance. This can result in large area, additional layout/matching effort, and degraded array performance.

Embodiments of the present disclosure address these problems by measuring the mismatch between driver strength and resonance frequency of different instances in the VCO array and making adjustments to each local instance to mitigate mismatch and therefore optimize performance.

Embodiments of the present disclosure provide a novel approach to mitigating mismatch and imbalance effects between different VCO instances in a large array of parallel VCOs. Creating arrays of multiple VCOs is beneficial for realizing higher phase noise performance from the oscillator. The level of matching or balance between the instances in the array has a significant impact on phase noise performance. The approach that is described herein provides a mechanism for measuring and correcting for mismatch between an array of VCO instances.

Some embodiments of the present disclosure provide ultra-low phase noise VCO arrays for use in Radio Frequency (RF) systems, such as GSM (Global System for Mobile Communications) and other communications systems requiring low noise controllable oscillators. This is achieved by matching and balancing an array of integrated LC-based VCOs and taking an average of their signals as the overall oscillator clock signal.

A number of systems and methods are disclosed which may be used to produce well-balanced and matched arrays of LC VCOs on a monolithic integrated circuit. The systems and methods apply measurement and adjustment techniques to compensate for drive strength and/or L/C mismatch in arrays of LC VCOs. Phase noise achievable in a practical single LC VCO can be surpassed by combining a number of matched LC VCOs together in an array. The level of matching and balance between the individual LC VCOs must be maintained to realize a stable oscillation and optimize the performance of the array. By applying the measurement and correction techniques described in the present disclosure, optimized LC VCO arrays can be implemented in a readily-integrated and relatively low-cost system. Embodiments of the present disclosure are applicable in Radio Frequency Integrated Circuits (RFICs) targeting RF applications, and in other areas where high performance clock signals are required in an integrated circuit device.

Embodiments of the present disclosure provide a method and system of reducing mismatch between oscillators in an LC VCO array. In an embodiment, a method comprises measuring mismatch between the driver strengths by comparing the oscillation amplitudes of the LC VCOs, and measuring mismatch between the resonance frequencies of the LC VCOs, and adjusting each LC VCO to reduce the measured mismatches. In an embodiment, the measuring and adjusting is performed once to calibrate the array of VCOs. In another embodiment, the system measures and adjusts the array of VCOs repeatedly. In another embodiment, the LC VCO array has a master VCO and a plurality of slave VCOs connected to the master VCO by slave PLLs to reduce phase noise caused by mismatch.

As phase noise performance requirements in RF systems become more stringent, the number of elements (N) in a multi-core VCO array increases, and the conditions to match the elements become more difficult. In this situation, the methods and systems presented in this disclosure to match the output signals of the VCO elements in a large size array become more crucial in order to reach the best performance level.

Figure 2B:
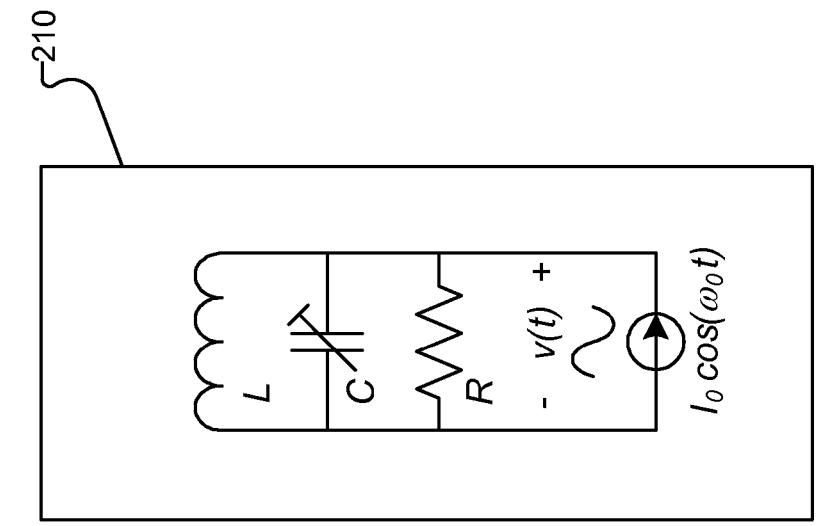
FIG. 2B shows a simple model of the LC VCO of FIG. 2A.
Figure 2A:
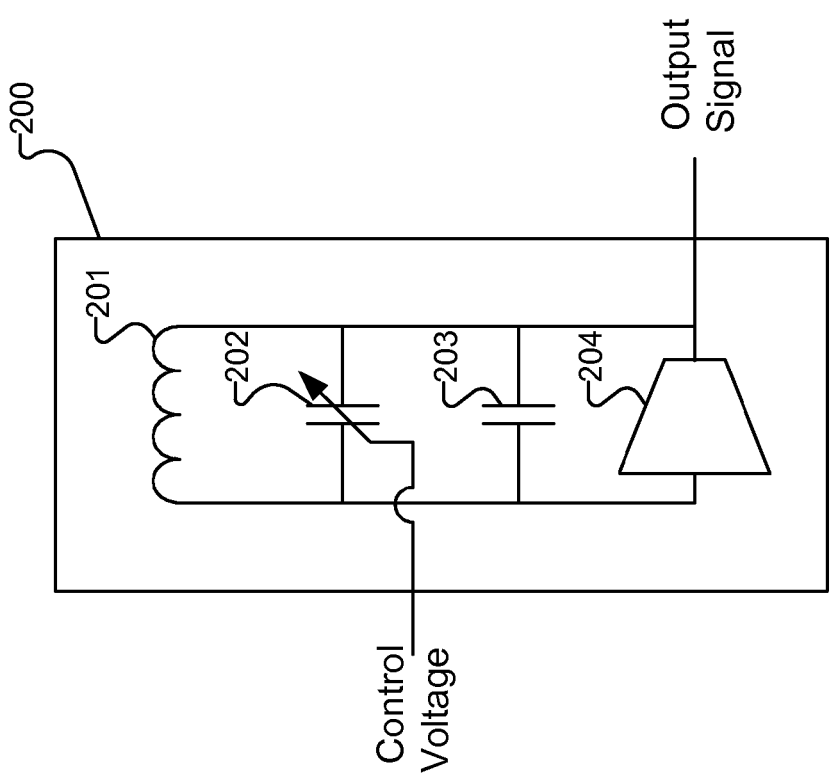
FIG. 2A shows a known basic LC VCO.
Figure 3:
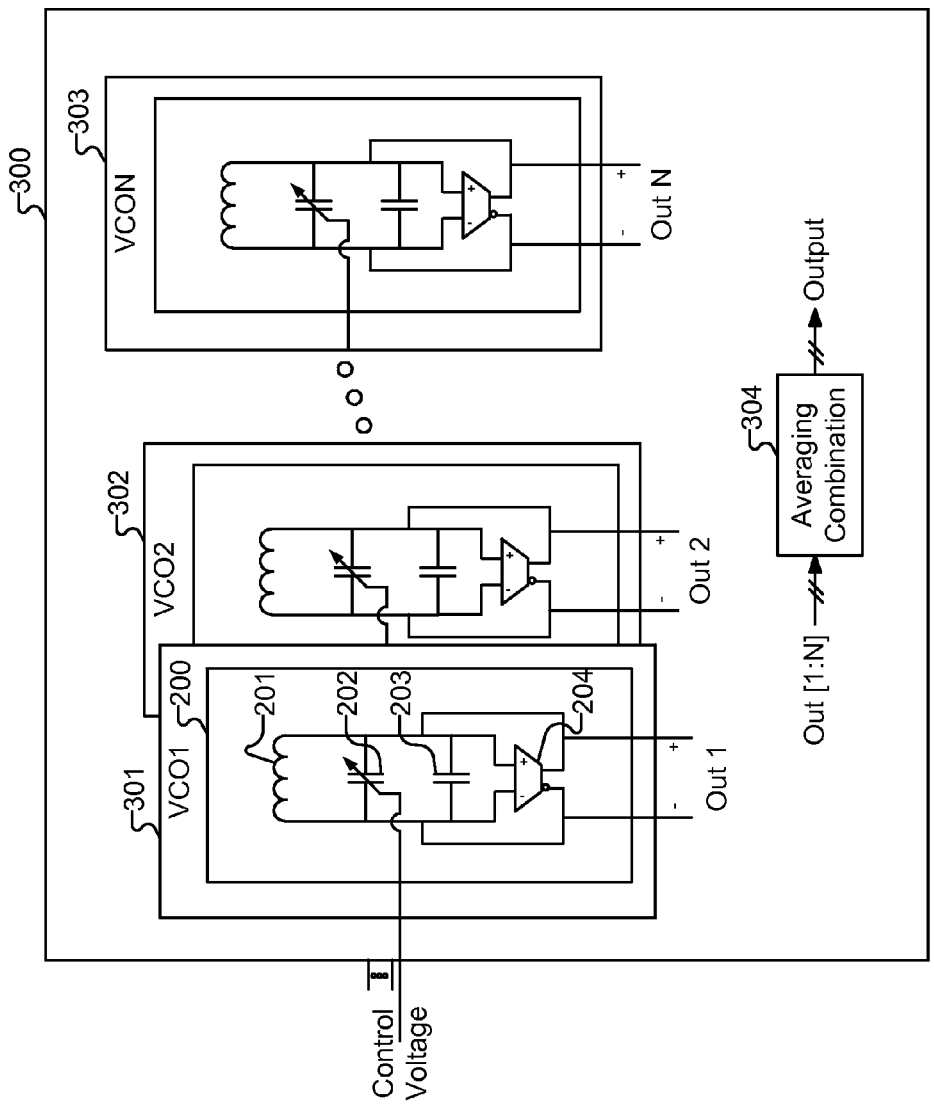
FIG. 3 shows a known LC VCO array.
Figure 4B:
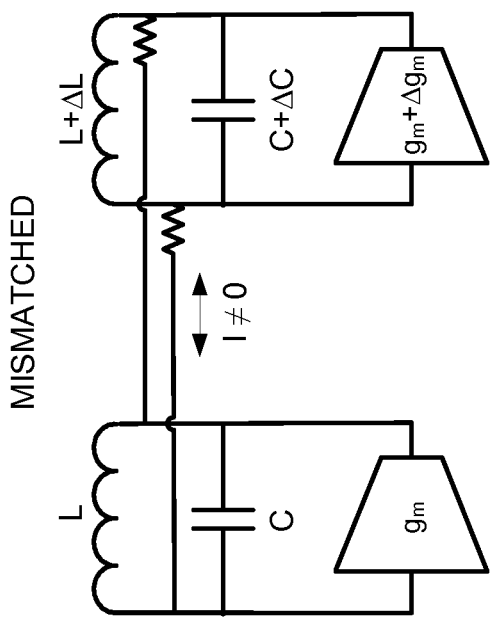
FIG. 4B illustrates a known LC VCO array with mismatched circuits.
Figure 4A:
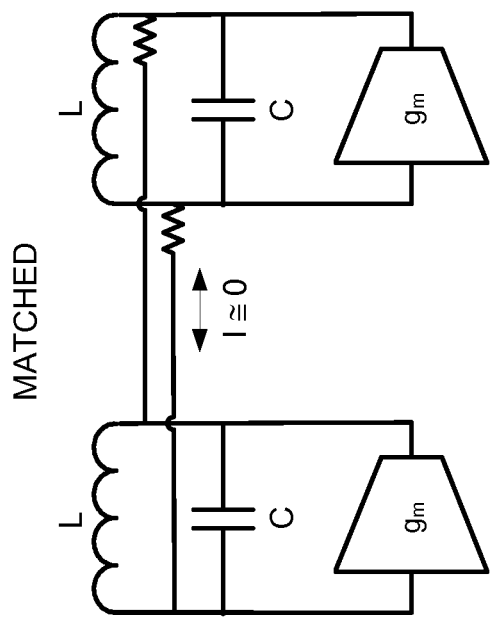
FIG. 4A illustrates a known LC VCO array with matched circuits.

The individual LC VCO elements that are intended to be used together in an array cannot be created with completely identical characteristics (even though they are fabricated on a single monolithic integrated circuit). An individual LC VCO (such as, for example VCO 200 of FIG. 2A) is made up of fundamental components including a driver 204, an inductor 201, a fixed capacitor 203 and a voltage-tunable variable capacitor, or varactor 202. In an integrated circuit, the driver's strength exhibits variations due to manufacturing variations (systematic and random) across the IC die that in turn translates to mismatch in oscillation swing across the VCO array. Another source of driver strength imbalance is variations in the power supply level at different locations on semiconductor substrate due to unequal resistive losses in the power supply connections. The frequency of an LC VCO depends on inductance and capacitance, as shown in equation 3. The fixed capacitor, which is created using a mixture of metal-metal capacitors (e.g., Metal-Oxide-Metal (MoM), or Metal-Insulator-Metal (MiM)) and device (e.g., Metal-Oxide-Semiconductor or MOS transistor) capacitance, exhibits the same types of manufacturing variations. The inductance is a large physical structure compared to minimum dimensions in an integrated circuit so random variations in inductances are negligible; inductance variations would come from systematic differences in the layout metallization around each LC VCO, which can impact the magnetic fields and slightly impact inductance. Varactor capacitance characteristics would be subject to the manufacturing variations described above for the fixed MOS capacitance and the driver, but because the varactor is generally a relatively small capacitance element compared to the fixed capacitance in the LC tank, the variations in varactor characteristics can be considered of secondary importance. Because of these differences between individual LC VCO elements in the array, inherent mismatches inhibit optimal SNR characteristics.

Figure 5A:
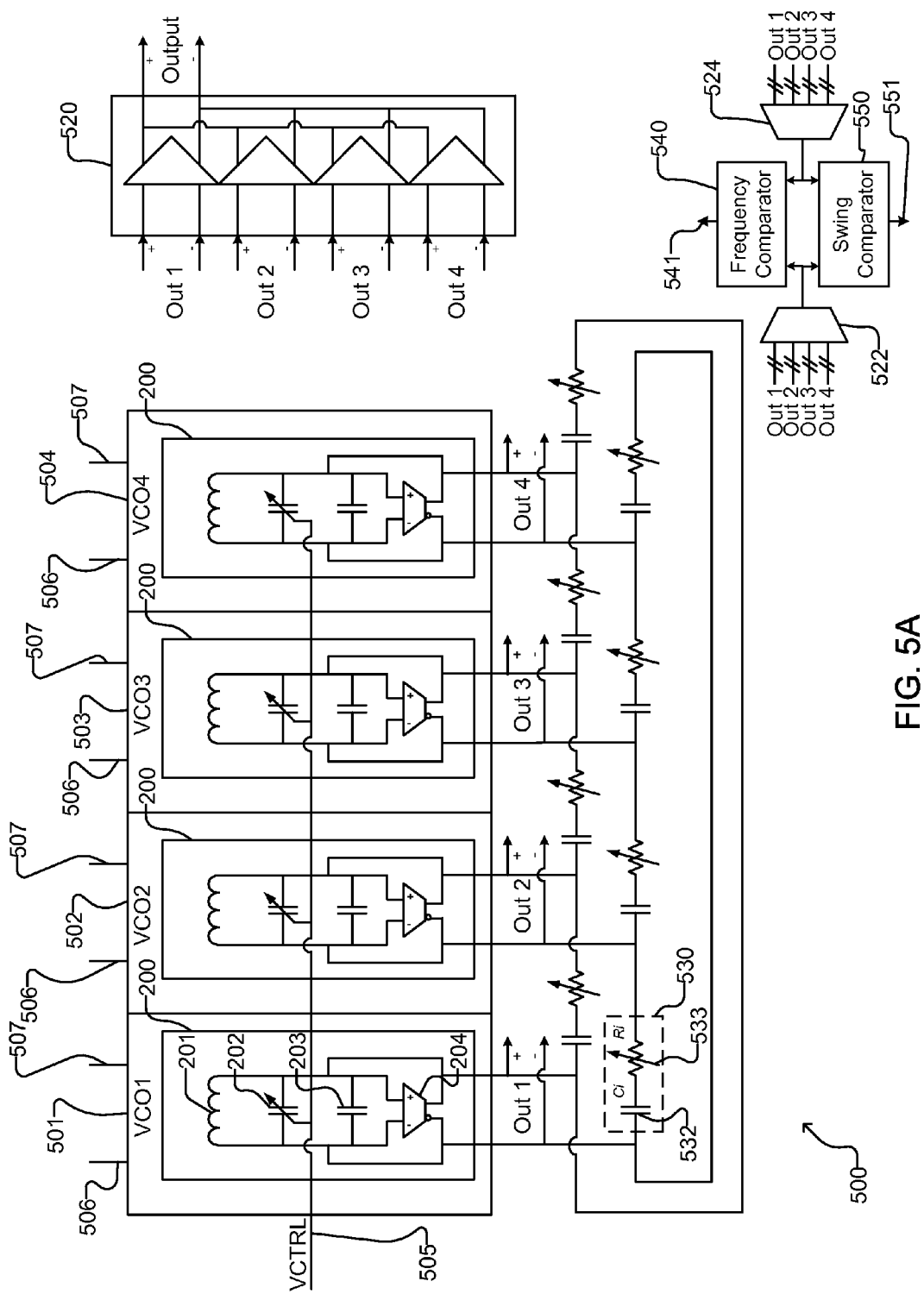
FIG. 5A illustrates a system for reducing mismatch between oscillators in an LC VCO array according to an embodiment of the present disclosure.

FIG. 5A shows an N-element LC VCO array system 500 according to an embodiment of the present disclosure. The example depicted is for N=4, but it is to be understood that the LC VCO array system 500 could have any practical number of LC VCO elements. The LC VCO array system 500 comprises four LC VCO elements 501, 502, 503, 504, individually designated as VCO1, VCO2, VCO3, VCO4 respectively for ease of reference. Each of the LC VCO elements 501, 502, 503, 504 comprises an LC VCO core which, in the FIG. 5 example is illustrated as the basic LC VCO 200 of FIG. 2A, with an inductor 201, varactor 202, capacitor 203, and driver 204. However, it is to be understood that the individual elements of the LC VCO array may have different topologies in other embodiments. The varactors of the LC VCO elements 501, 502, 503, 504 are all connected to be controlled by a single control voltage VCTRL at a common control input 505 to fine tune the desired output frequency and phase. Each of the LC VCO elements 501, 502, 503, 504 also comprises a frequency adjustment input 506 operatively coupled to an internal independent frequency adjustment (also known as frequency calibration) mechanism (not shown in FIG. 5A) such that the frequency of the output from element 501/502/503/504 varies in response to one or more digital or analog control signals at the respective frequency adjustment input 506, as described further below with reference to FIGS. 8A-C, to minimize frequency mismatches among multiple VCO cores in the VCO array. The frequency adjustability provided by the frequency adjustment input 506 and associated frequency calibration mechanism may be relatively coarser than the adjustability provided by the common control input 505 in some embodiments. Each of the LC VCO elements 501, 502, 503, 504 also comprises a swing adjustment input 507 operatively coupled to an internal independent swing adjustment (also known as amplitude calibration) mechanism (not shown in FIG. 5A) such that the amplitude of the output from element 501/502/503/504 varies in response to one or more digital or analog control signals at the respective swing adjustment input 507, as described further below with reference to FIGS. 10A-C, to minimize amplitude mismatches among multiple VCO cores in the VCO array.

The LC VCO elements 501, 502, 503, 504 are electrically-connected in a parallel manner. The outputs of the LC VCO elements 501, 502, 503, 504 (individually designated as Out 1, Out 2, Out 3, Out 4, respectively) are summed together by shorting together buffers 520, connected to each VCO core output, on a common output node. The common output node of the buffers 520 may be used to generate a single output of the LC VCO array, the single output comprising an average of the individual outputs of the LC VCO elements 501, 502, 503, 504.

The outputs of the LC VCO elements 501, 502, 503, 504 are also connected through interconnection paths, which comprise a plurality of interconnect elements 530 along two parallel paths connecting corresponding polarity nodes of each output, with an interconnect element 530 between each pair of adjacent output nodes. In the FIG. 5A example, each interconnect element comprises a capacitor 532 and a variable resistor 533. The interconnect elements 530 on the interconnection paths have a calibration mode wherein the impedance of the interconnect elements 530 is increased, and a functional mode wherein the impedance of the interconnect elements 530 is decreased, as described below.

The outputs of the LC VCO elements 501, 502, 503, 504 are also connected to two 4:1 multiplexers 522, 524. The multiplexers 522, 524 in turn selectively provide, under control of a controller (not shown), two of the outputs to a frequency comparator 540 and a swing comparator 550. The frequency comparator 540 generates an output 541 determined by mismatch between the frequencies of the two selected LC VCO outputs, and the swing comparator 550 generates an output 551 determined by mismatch between the amplitudes of the two selected LC VCO outputs. The outputs 541 and 551 of the frequency and swing comparators 540 and 550 are provided to one or more controllers (not shown) for applying suitable signals to the frequency and swing adjustment inputs 506 and 507, respectively, to adjust the frequency and amplitude of the LC VCO elements 501, 502, 503, 504 based on the outputs 541 and 551.

As discussed above, any mismatch in the frequency or amplitude of the signal on each LC VCO element, compared to the others, causes current to circulate through the interconnection paths. Current flowing through the interconnection paths is wasted and not used to overcome losses to generate swing on the individual LC resonant tanks, hence such mismatch current causes the drivers (transistors) to require higher drive strength. Their higher drive strength will directly result in higher noise generated by the drivers and consequently degradation of the VCO phase noise performance. The system 500 of FIG. 5A enables frequency and amplitude mismatches to be minimized to reduce this mechanism of performance degradation.

Figure 6B:
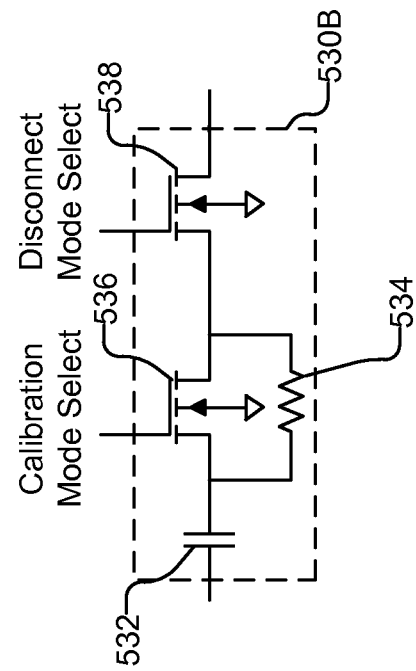
FIG. 6B illustrates another example interconnect element for the system of FIG. 5A according to one embodiment.
Figure 6A:
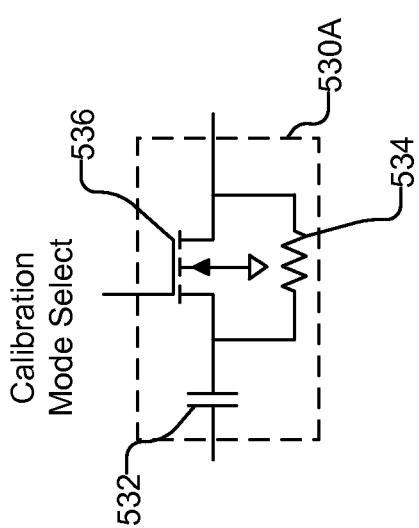
FIG. 6A illustrates an example interconnect element for the system of FIG. 5A according to one embodiment.

FIGS. 6A and 6B respectively show alternate interconnect elements 530A and 530B which may be used in place of the interconnect elements 530 of FIG. 5A. As noted above, the interconnection impedance is increased during calibration mode to allow each VCO element to be more autonomous so that differences in the amplitude and/or frequency are more pronounced and are more easily measureable. Interconnection impedance is decreased during functional mode, hence residual frequency and amplitude imbalance after calibration is minimized by the low impedance connection between VCO elements. Interconnect element 530A of FIG. 6A comprises a parallel connected bypass resistor 534 and NMOS transistor switch 536 in series with the capacitor 532. The NMOS transistor switch 536 is controlled by its Gate voltage. By opening the NMOS transistor switch 536 during calibration mode, the impedance is increased to the resistance value of the bypass resistor 534. By closing the NMOS transistor switch 536 during functional mode the impedance is lowered to the ON resistance of the NMOS transistor switch 536. The calibration mode resistance due to the bypass resistor 534 should be large enough to allow natural frequency and amplitude differences amongst the VCO array elements to be measurable. Practical resistance values of the bypass resistor 534 are in the range of 10-50 kΩ, though the exact value is not critical. The capacitive coupling provided by the capacitor 532 is chosen such that its impedance is negligible at the VCO oscillation frequency; the capacitor 532 blocks any DC current flow between VCO tanks. DC current flow between the elements of the array, for some VCO architectures, would complicate the independent swing comparison and calibration mechanism. If this is not an issue, a simpler scheme may be adopted without the capacitor 532.

During calibration mode, besides some degree of electrical isolation achieved by a high interconnect resistance provided by the bypass resistor 534, the LC tanks must be sufficiently isolated from each other in an electromagnetic sense. This is to avoid the impact of magnetic (H) and/or electric (E) field from one oscillating LC tank onto other LC tank(s) in close proximity on semiconductor die that could cause unwanted frequency pulling or injection locking effects. Magnetic isolation of inductors on a semiconductor die requires specific attention to spacing between inductors (larger spacing improves the isolation, but worsens matching amongst VCO elements, and potentially increases power consumption), orientation of the spiral turns, and layout environment in between the inductors. The use of magnetic shields (low-resistance metal rings, not shown) around the spiral inductors helps the isolation, but could compromise the inductor's quality factor, hence there is a trade-off involved here. Simulation of 3-dimensional electromagnetic (3D EM) fields using computer-aided design (CAD) tools is the most practical way to quantify these effects and design an optimum layout placement for the LC tank array. Another alternative, as far as the calibration of frequency, is to measure the absolute frequency of the VCO elements one by one, while the other VCO elements are powered down, as discussed further below.

Interconnect element 530B of FIG. 6B is similar to interconnect element 530A of FIG. 6A, but also comprises a second series NMOS transistor switch 538. Through controlling Gate voltage of switch 538, a disconnect mode can be selected. In this mode, the interconnect element 530B is open-circuit, hence the corresponding VCO element(s) will be disconnected from the VCO array. In other words, the variable resistor 533 in FIG. 5 is set to "Ri=∞". By combining the disconnect mode and powering down (disabling) the corresponding VCO element(s) in the array, a flexible VCO array is realized, in which oscillation phase noise in the functional mode of operation can be throttled vs. power consumption. For instance, disconnecting and disabling M out of N VCO element(s) means lower power consumption by a scaling factor of [1−(M/N)], but higher phase noise, where phase noise is shifted up by [10×$\log_{10}$[1−(M/N)]] in decibel units (dB).

Alternatively, as known to those skilled in the art, switches 536 and 538 can be implemented using PMOS transistors, or using a parallel combination of NMOS & PMOS transistors, the latter is known as transmission gate. Once the elements of the VCO array are matched due to calibration process, there will be little/no current flowing through the interconnection paths in normal operation (functional mode), hence the effect of the resistance from the electronic switches 536 and 538 becomes relatively insignificant.

Frequency detectors are familiar to anyone experienced in electronic circuit design and especially digital IC design techniques. There are additional techniques well known to those skilled in the art to perform the frequency comparator function for multi-gigahertz applications. One method to implement multi-gigahertz frequency comparison for frequency calibration in the VCO array is to employ high-speed frequency dividers to divide down the output frequency of each VCO element first. Then the outputs of the said high-speed dividers will drive frequency comparator core(s). A frequency comparator core consists of two identical digital counters, preferably having programmable register lengths, to set the accuracy of the frequency comparison. The larger the counter register length, the longer it takes to do the frequency comparison, but the more accurate the result will be. Both counters are initialized to their maximum count value. One counter is clocked by a reference frequency and counts down from its maximum value. The other counter is clocked by the divided-down clock of a VCO element under test and counts down in a similar manner. When one of the two counters reaches its minimum count value (all-zero bits), the bit status of the other counter is read as a direct measure of frequency difference between the two counters. The reference input to the frequency comparator core can be from a fixed reference clock source in the system (to perform absolute frequency measurement on each VCO element in the array), or it can be from the divided-down clock of a VCO element chosen as a reference for relative frequency comparison within the array.

Figure 7:
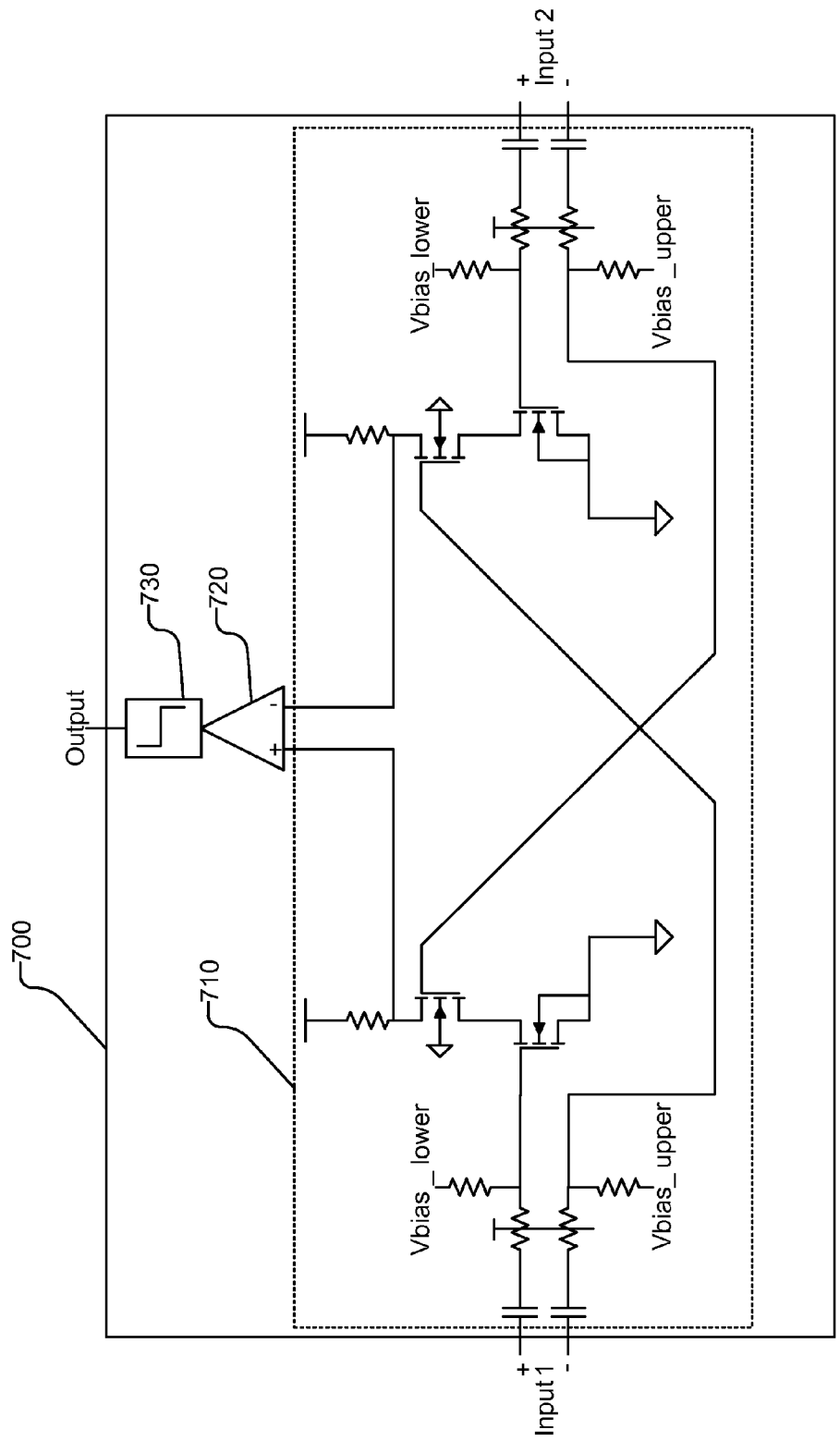
FIG. 7 illustrates an example phase/frequency comparator for the system of FIG. 5A according to one embodiment.

In general, since phase ($\phi$) is the integral of frequency ($\omega$, or f) over time (t), any small frequency difference can ultimately be detected/interpreted as a phase difference. Therefore, an alternative embodiment of the above VCO array frequency calibration scheme may employ a special class of comparator circuits known as Phase/Frequency Detectors (PFDs). FIG. 7 shows an example phase/frequency comparator circuit 700 which may be used as the frequency comparator 540 of FIG. 5A. As noted above, the output of each VCO element is selectably connectable to the phase/frequency comparator circuit 700 through an analog multiplexer 522/524. The phase/frequency comparator circuit 700 is able to compare the frequency of any 2 elements in the LC VCO array. During frequency calibration mode, the interconnect sections 530/530A/530B are put in the high-impedance state, to maximize the observable frequency differences between the elements in the array. The frequency comparison can be done with increased accuracy by allowing more time to perform elongated measurements and average the results. In the FIG. 7 example, the output of a phase/frequency detector 710 is amplified 720 and digitized 730 into a 1-bit value, and the digital output indicates which VCO has a phase/frequency which is advanced relative to its partner. The digital output from the phase/frequency comparator circuit 700 is provided to a controller (not shown) which in turn provides an adjustment signal to a frequency adjustment input of one or more of the VCO elements.

Figure 8:
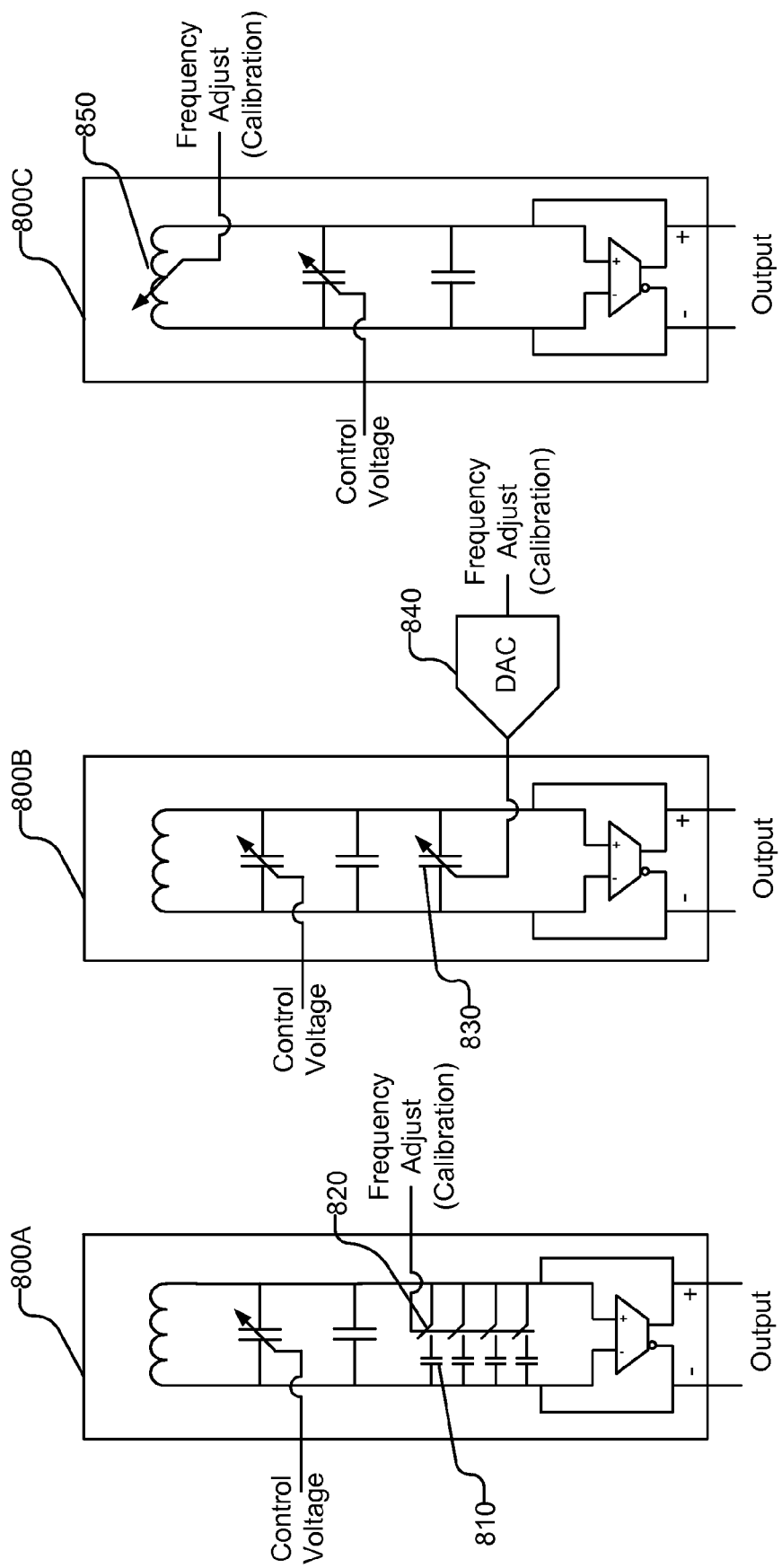
FIG. 8A illustrates an example phase/frequency adjustment circuit for an LC VCO of the system of FIG. 5A according to one embodiment.
FIG. 8B illustrates another example phase/frequency adjustment circuit for an LC VCO of the system of FIG. 5A according to one embodiment.
FIG. 8C illustrates another example phase/frequency adjustment circuit for an LC VCO of the system of FIG. 5A according to one embodiment.

In any case, after any frequency differences are measured within the VCO array, either the fixed capacitance or inductance on each LC tank is incrementally adjusted to match frequencies between the two elements in the VCO array that are compared. For most implementations frequency adjustment is preferably achieved by adjusting the capacitance of the LC tank. FIGS. 8A and 8B show VCO cores 800A and 800B with two example capacitor adjustment mechanisms. In VCO core 800A of FIG. 8A, the capacitance is adjusted by controlling switches 820 that are progressively closed (or opened) to add (or remove) small capacitance elements 810 onto an individual VCO element to decrease (or increase) its frequency. In VCO core 800B of FIG. 8B, the capacitance is adjusted by adjusting the value of a high-resolution digital-to-analog converter (DAC) 840 whose output drives the control voltage of a voltage-controlled variable capacitor, or varactor 830, hence adjusting the frequency of the corresponding VCO element.

In some implementations, frequency adjustment can be achieved by adjusting the inductance of the LC tank. FIG. 8C shows a VCO core 800C with an example inductance adjustment mechanism. In VCO core 800C, the inductance is adjusted by providing a control signal to a variable inductor 850. Variable inductors are typically harder to implement than variable capacitors, and in most integrated circuits operating in the multi-gigahertz range or lower, capacitance adjustment is more practical and useful than inductance adjustment; one reason being higher quality factor of variable capacitors than inductors in these frequencies. Variable inductors (generally implemented via loaded coupled inductors) can degrade the quality factor of the inductor and hence the LC tank. At much higher frequencies (e.g., over 30 GHz, also known as millimeter wave (mmW) band), however, variable capacitors can have lower Q factors than variable inductors, hence in some applications variable inductors may be desirable, despite their implementation complexity.

The causes of VCO frequency or capacitor imbalance are primarily static effects. In some embodiments, the measurement and correction activity, i.e. frequency calibration, may be performed during a one-time calibration step at production test. In some embodiments, the frequency calibration may be performed at device power-up.

To avoid the electromagnetic coupling effects amongst LC VCO elements during the frequency calibration noted above, an alternative embodiment can be employed to perform an accurate absolute frequency measurement on one active LC VCO, while the remaining (N−1) LC VCO elements are disabled. (This is in contrast with relative frequency measurement between two active VCOs, shown in the FIG. 5A example.) The frequency calibration procedure would then repeat this step for the other (N−1) VCO elements one at a time, while the other VCOs are disabled, in order to adjust and match the absolute frequency of each and every VCO under test to that of the first VCO element. Although this alteration is not shown in FIG. 5A, it can be implemented by introducing an accurate reference clock and a 2:1 multiplexer to multiplex in the said reference clock at the output of one of the existing N:1 multiplexers 522/524. An example system 500B with such an implementation is shown in FIG. 5B, which is the same as the system 500 of FIG. 5A other than in system 500B the frequency comparator 540 receives one of its inputs from a reference clock source 523 instead of the multiplexer 522 (the other input to the frequency comparator 540 in system 500B is still provided by the other multiplexer 524).

Figure 5B:
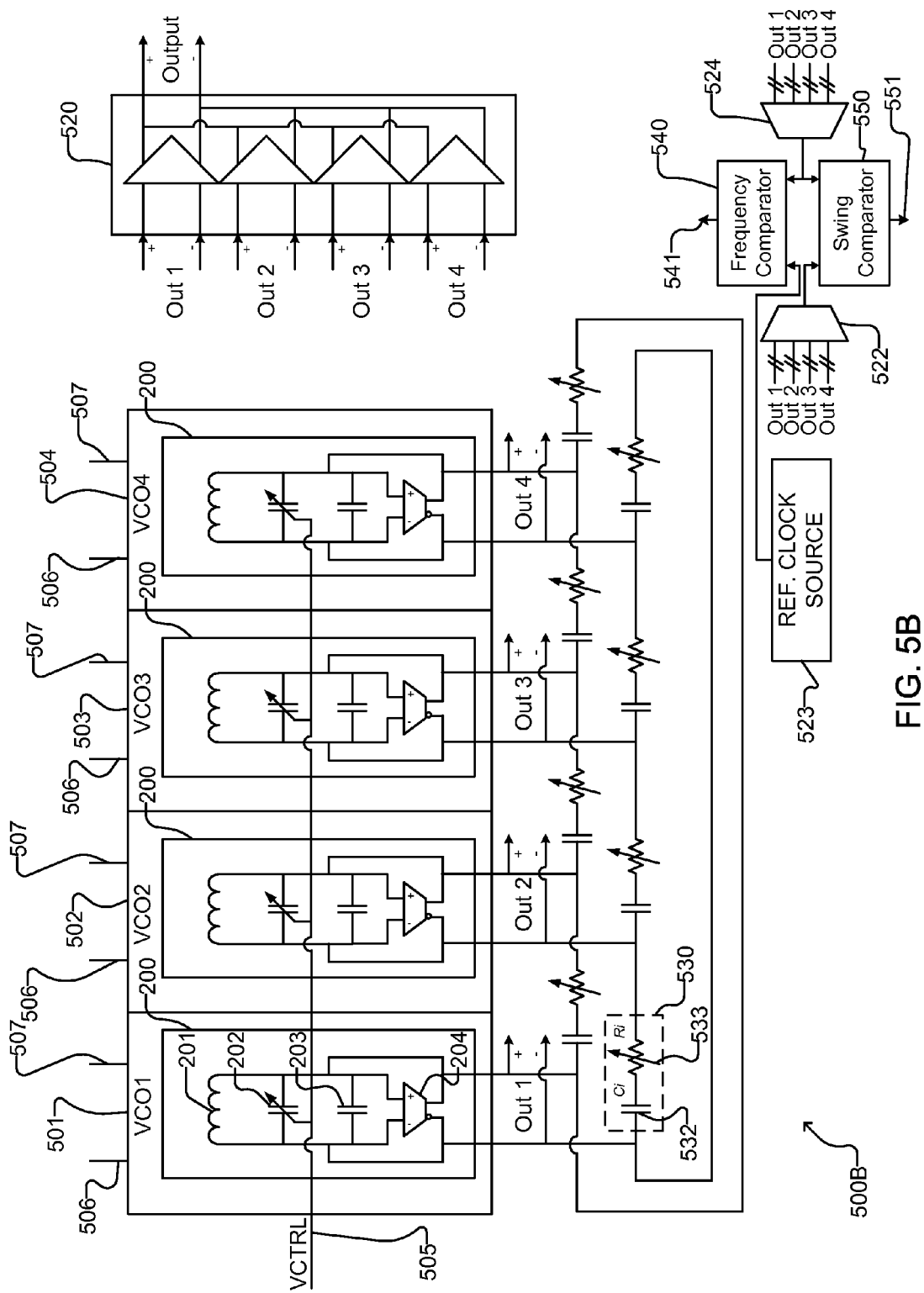
FIG. 5B illustrates a system for reducing mismatch between oscillators in an LC VCO array according to another embodiment of the present disclosure.
Figure 5C:
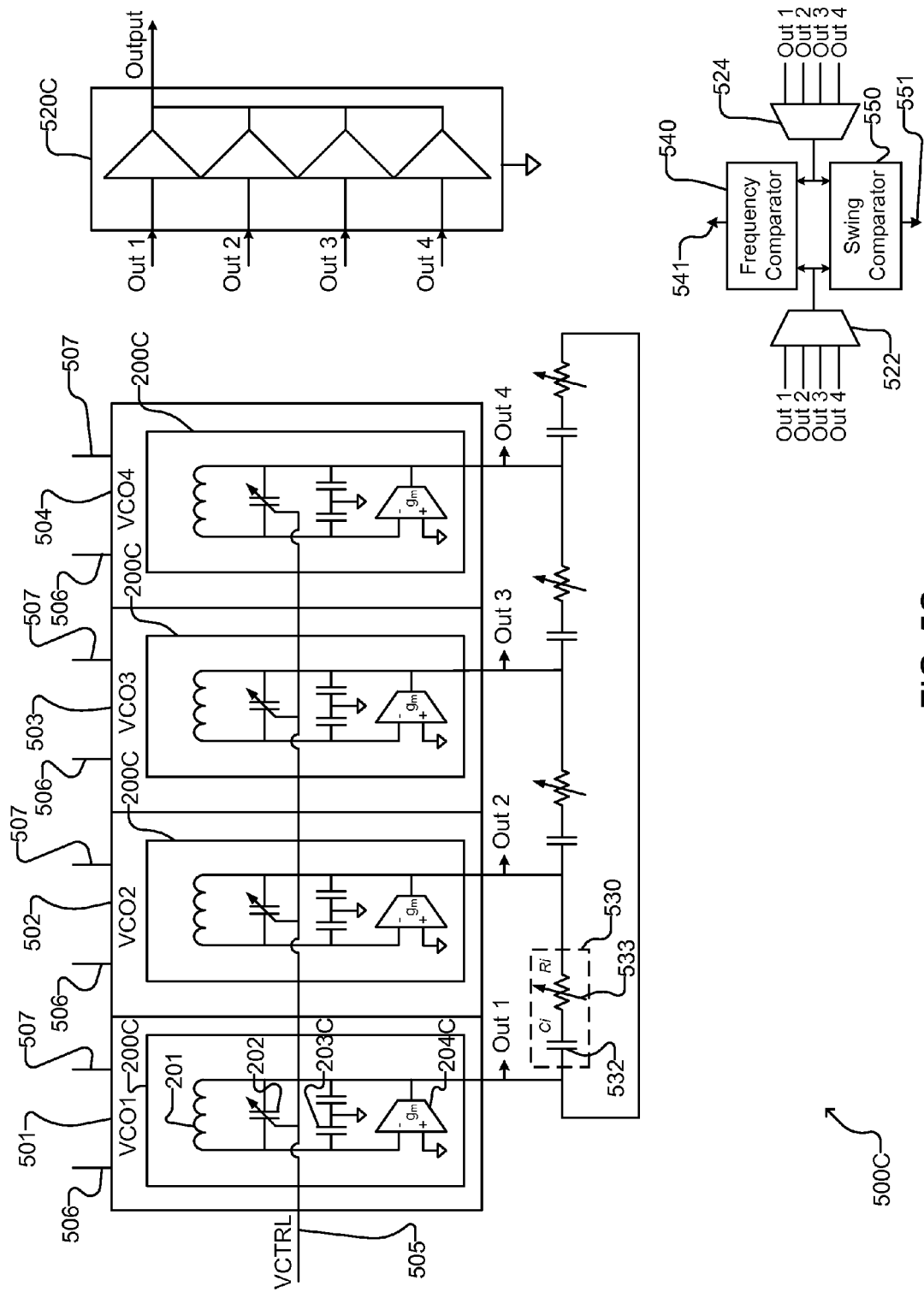
FIG. 5C illustrates a system for reducing mismatch between oscillators in an LC VCO array according to another embodiment of the present disclosure.

FIGS. 5A and 5B show example systems with differential VCO cores, but it is to be understood that mismatch reduction techniques according to the present disclosure may also be applied in systems with single-ended VCO cores. For example, FIG. 5C shows an N-element (N=4 in the illustrated example) LC VCO array system 500C. The system 500C is substantially similar to system 500A of FIG. 5A, except that system 500C comprises single-ended VCO cores 200C. In the example of FIG. 5C, a Colpitts-type LC oscillator core is illustrated. Each VCO core 200C comprises a single-ended driver 204C (transconductance amplifier $g_m$) that receives a sample of the LC tank oscillation across a capacitive voltage divider 203C and provides sufficient gain in the loop to overcome losses in a non-ideal LC tank in order to sustain oscillations. The system 500C also differs from system 500A of FIG. 5A in that the system 500C has a single interconnection path, with a plurality of interconnect elements 530 along the single interconnection path connecting the outputs of the plurality of VCO cores 200C, with one interconnect element 530 connected between each pair of adjacent outputs. The system 500C also differs from system 500A of FIG. 5A in that the system 500C uses single ended buffers 520C.

Figure 9:
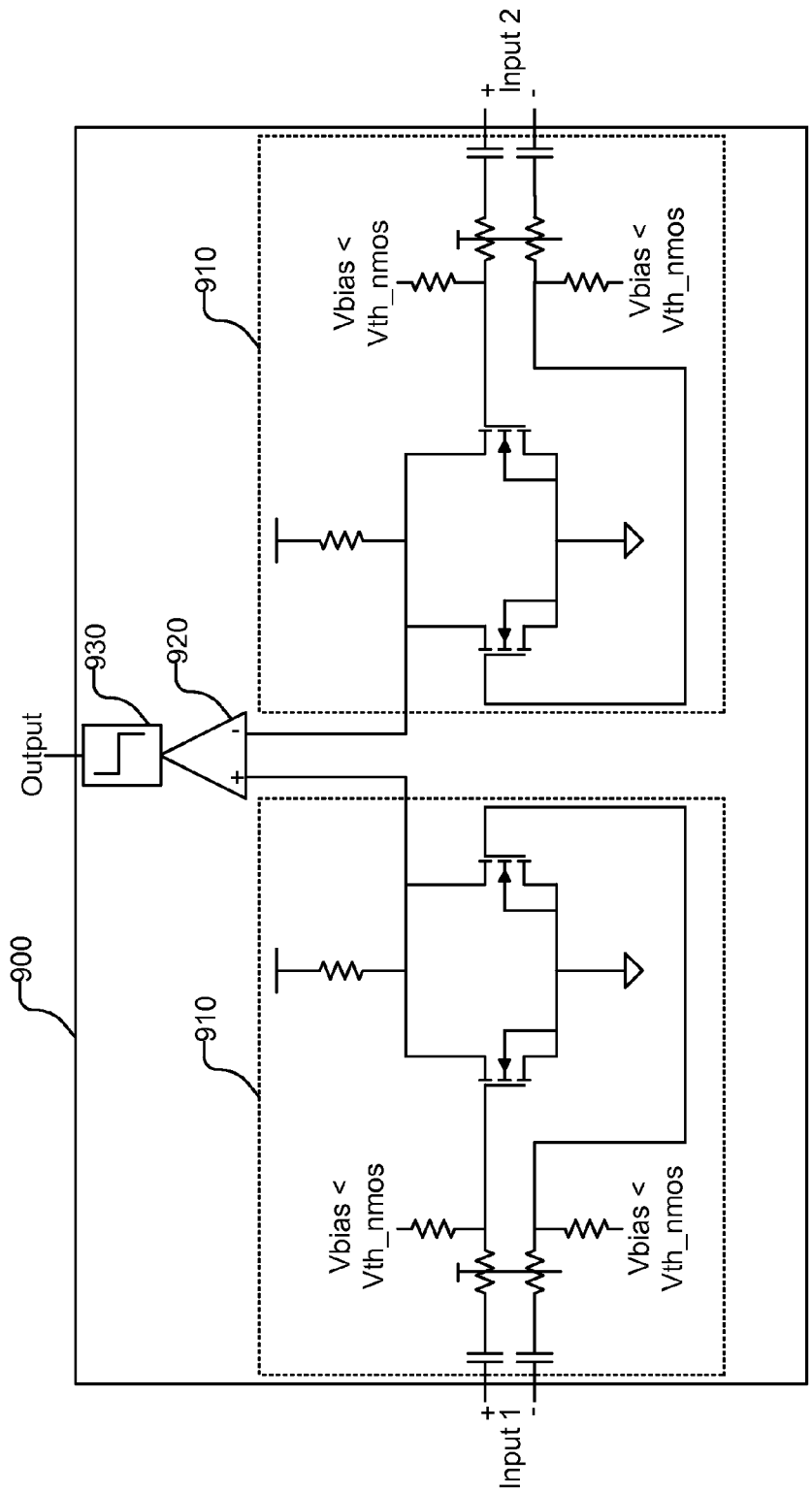
FIG. 9 illustrates an example swing comparator for the system of FIG. 5A according to one embodiment.

FIG. 9 shows an example swing comparator circuit 900 which may be used as the swing comparator 550 of FIG. 5A. As noted above, the output of each VCO element is selectably connectable to the swing comparator circuit 900 through an analog multiplexer 522/524. The swing comparator circuit 900 is able to compare the amplitude of any two elements in the LC VCO array. During amplitude calibration mode, the interconnect elements 530/530A/530B are put in the high-impedance state, to maximize the observable swing differences between the elements in the array. The swing comparison can be done with increased accuracy by allowing more time to perform elongated measurements and average the results. In the illustrated example, the swing comparator circuit 900 comprises two swing detectors 910 connected to receive the outputs of the two elements of interest of the LC VCO as inputs to the swing detectors 910. The outputs of the swing detectors 910 are compared 920 and digitized 930 into a 1-bit value and the digital output indicates which VCO has a larger swing. The digital output from the swing comparator circuit 900 is provided to a controller (not shown) which in turn provides an adjustment signal to a swing adjustment input of one or more of the VCO elements. Swing or peak detectors are familiar to anyone experienced in the RFIC design techniques. There are additional techniques well known to those skilled in the art to perform the swing comparison function here.

Figure 10C:
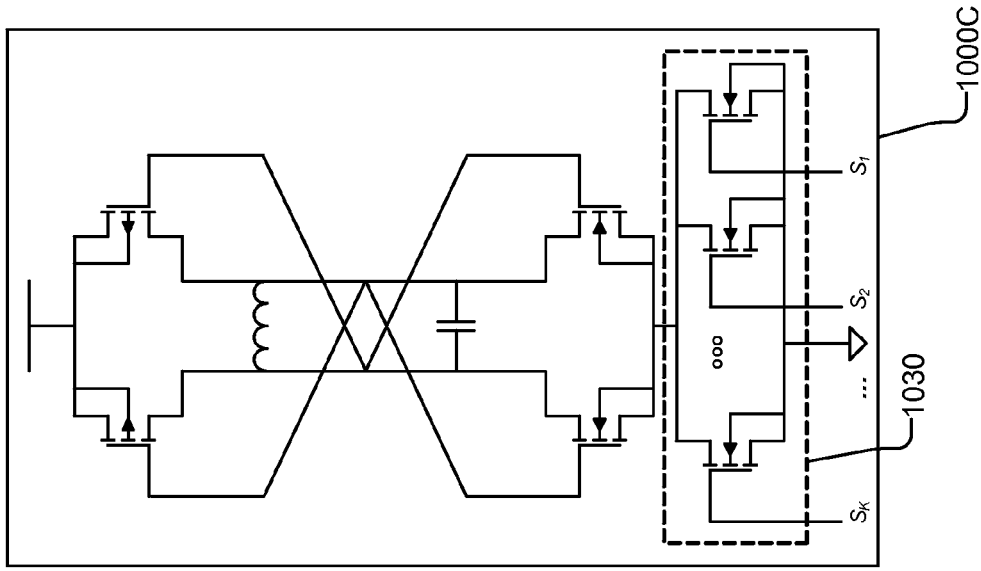
FIG. 10C illustrates another example swing adjustment circuit for an LC VCO of the system of FIG. 5A according to one embodiment.
Figure 10B:
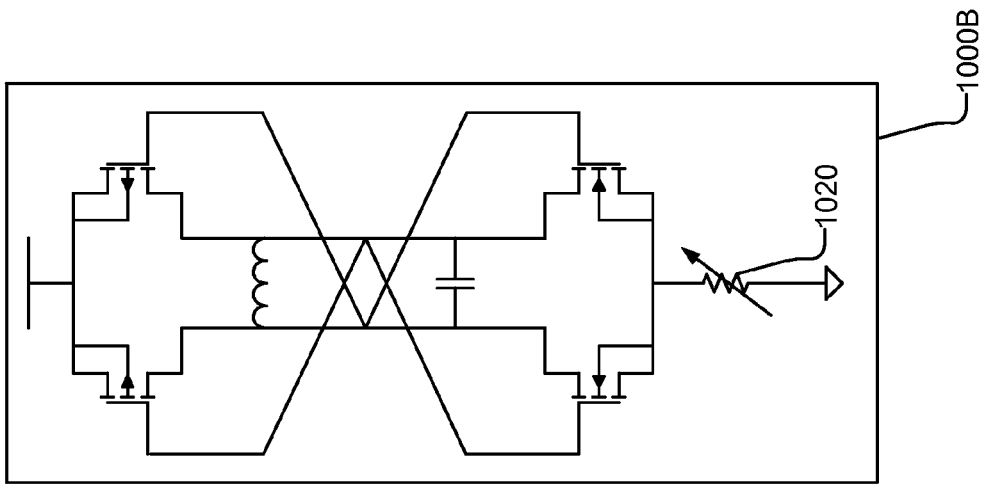
FIG. 10B illustrates another example swing adjustment circuit for an LC VCO of the system of FIG. 5A according to one embodiment.
Figure 10A:
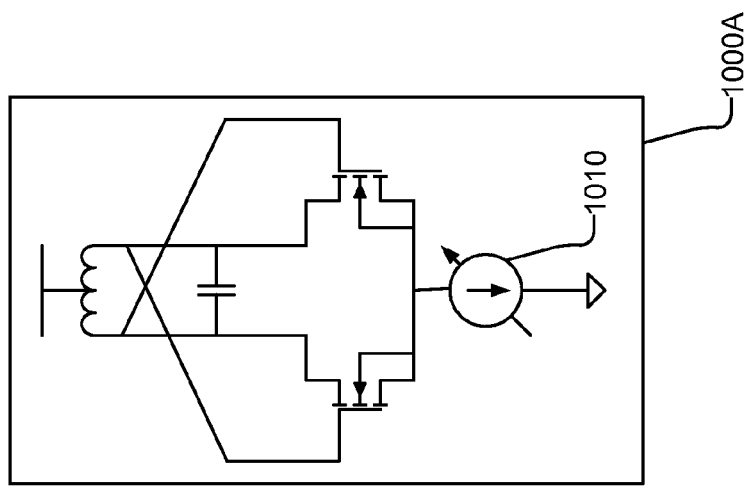
FIG. 10A illustrates an example swing adjustment circuit for an LC VCO of the system of FIG. 5A according to one embodiment.

Using output information from the swing comparator, the swing is adjusted to match swings between the 2 elements in the VCO array that are compared. The nature of the swing adjustment mechanism is dependent on the nature of the LC VCO topology. FIGS. 10A, 10B and 10C show example swing adjustment mechanisms for three different types of VCOs 1000A, 1000B and 1000C, respectively. For the case where the VCO driver, or gain block, is one cross-coupled pair of NMOS or PMOS transistors, or two cross-coupled pairs of complementary NMOS and PMOS transistors, with a bias current to control the driver gain, as in VCO 1000A of FIG. 10A, the gain may be adjusted by tuning the bias current 1010. For the case where no bias current is included and the VCO simply swings from the power to ground rail, as in VCO 1000B of FIG. 10B, a small programmable resistance 1020 is included in between the VCO and ground to introduce a small amount of resistance or negative feedback, and slightly reduce the gain of the VCO driver and hence the VCO swing across the LC tank. Another swing adjustment alternative without bias current is illustrated by VCO 1000C of FIG. 10C, which employs a parallel transistor array 1030, where the transistors are NMOS or PMOS type operating in their triode region to serve as resistors, and controlled digitally through their Gate inputs. The control inputs ($S_K$, . . . , $S_2$, $S_1$) set the equivalent resistance of the array 1030 as a parallel combination of ON resistance ($r_{ON}$) and OFF resistance ($r_{OFF}$) of the respective transistor switches in the array 1030.

By comparing the swing between all elements in the VCO array, using software, firmware or digital hardware control, and making necessary adjustments on the included swing adjustment mechanism, the oscillator swings are balanced across the VCO array, thereby mismatch effects from various sources are cancelled out. The causes of VCO driver imbalance are primarily static effects. In some embodiments, the measurement and correction activity, i.e. swing calibration, may be performed during a one-time calibration step at production test. In some embodiments, the swing calibration may be performed at device power-up.

In functional mode of operation, since the VCO tanks are electrically connected through low interconnect resistance, any residual mismatch between the natural resonant frequencies of VCO elements is compensated for by small amounts of current flowing through the interconnects to enforce a single oscillation frequency and virtually the same oscillation phases on all VCO elements. As noted above, this residual interconnect current is not desired and the goal of the frequency and amplitude calibration is to eliminate such current.

Figure 11:
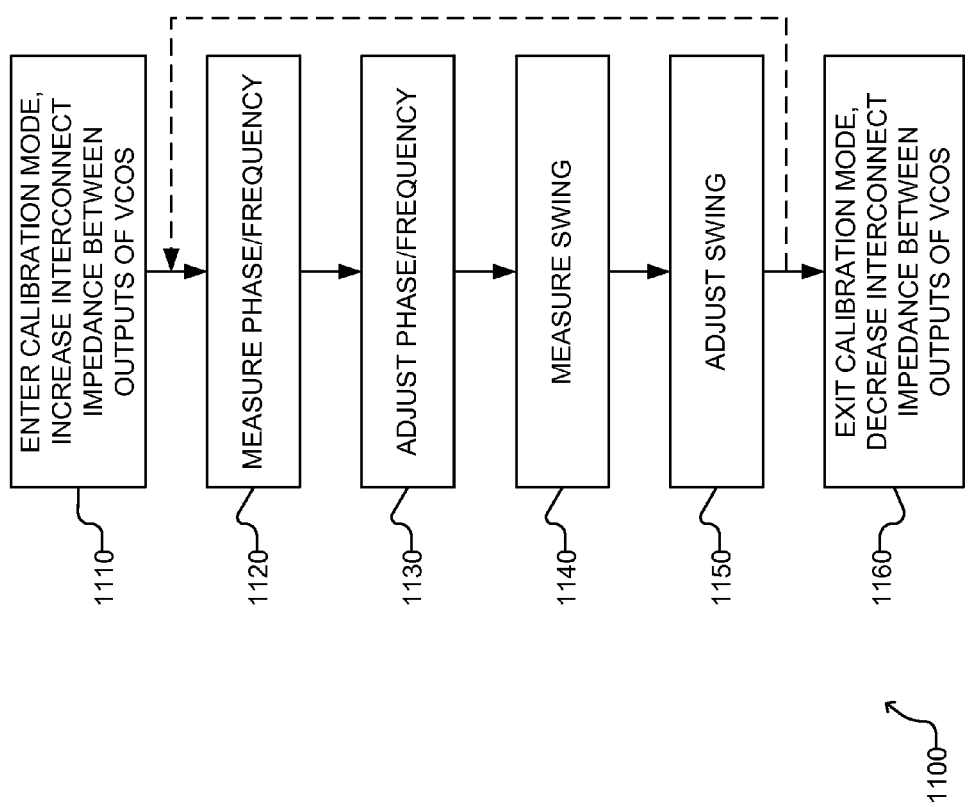
FIG. 11 is a flowchart illustrating an example method of calibrating an LC VCO array according to one embodiment.

In general, considering both frequency- and amplitude-calibration steps, the preferred calibration sequence is to do the frequency calibration first, and then perform the amplitude calibration. This is due to the fact that the amplitude calibration is done by changing the tail current source/resistance value, which has very little impact, if any, on the oscillation frequency. However, the frequency adjustments done by changing the capacitance (as in FIGS. 8A and 8B) or inductance (as in FIG. 8C) of the LC tank can in practice affect the Q factor and hence the oscillation amplitude. FIG. 11 shows an example calibration method 1100 for an LC VCO array according to one embodiment. At 1110 the impedance of the interconnect elements along the interconnect paths are increased, such that the LC VCO array enters calibration mode. At 1120 the phases/frequencies of the individual VCO elements are measured. At 1130 the phases/frequencies of the individual VCO elements are adjusted. At 1140 the swings of the individual VCO elements are measured. At 1150 the swings of the individual VCO elements are adjusted. For more accuracy, in some embodiments the sequence of frequency and amplitude calibration can be repeated to minimize/remove any residual impact of the amplitude calibration on the frequency, as indicated by the dashed line in FIG. 11. At 1160 the calibration mode is exited, and the impedance of the interconnect elements along the interconnect paths are decreased.

Figure 12:
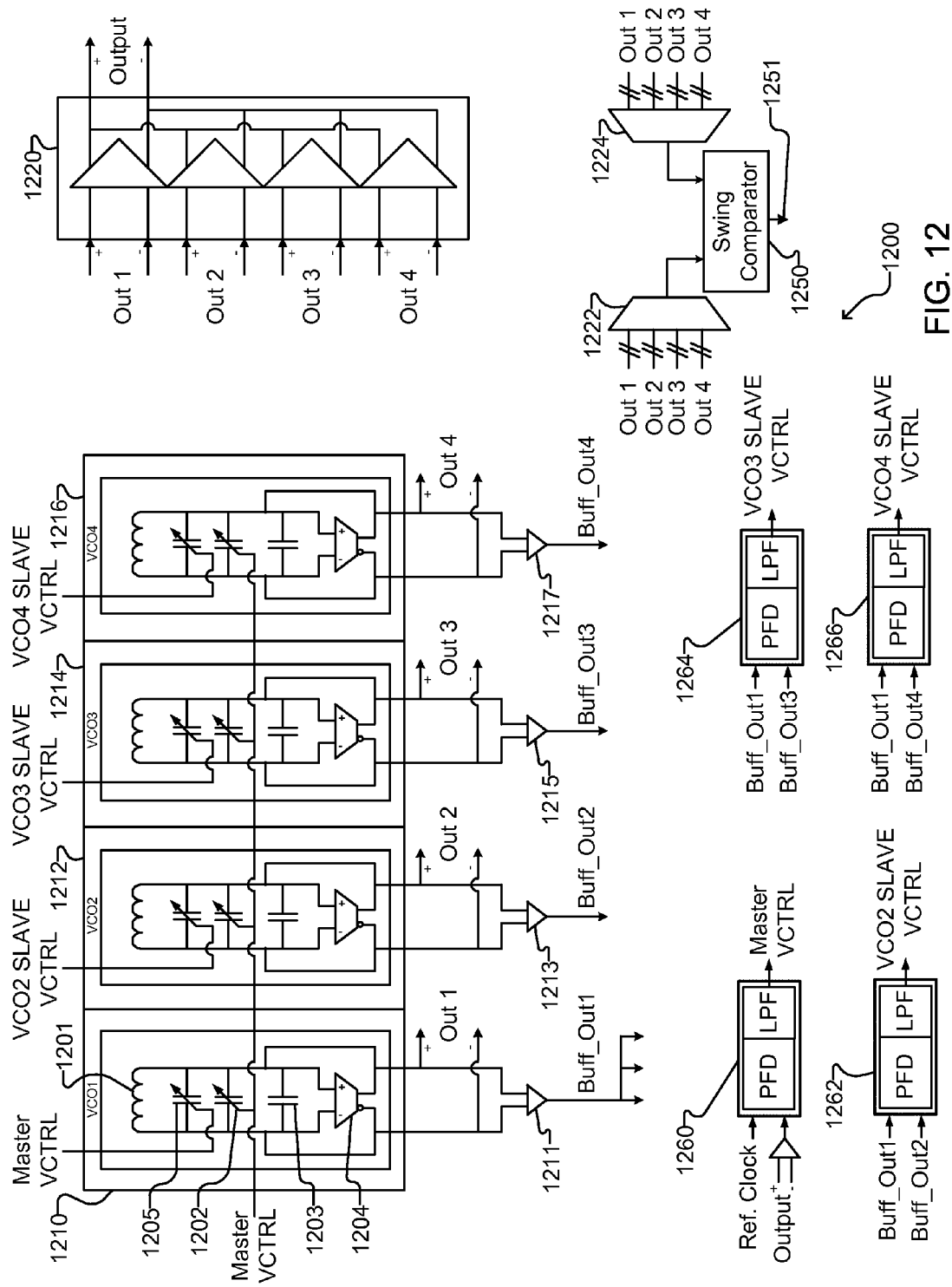
FIG. 12 illustrates a system for reducing mismatch between oscillators in an LC VCO array according to another embodiment of the present disclosure.

FIG. 12 shows an N-element LC VCO array system 1200 according to an embodiment of the present disclosure. The example depicted is for N=4, but it is to be understood that the LC VCO array system 1200 could have any practical number of LC VCO elements. The LC VCO array system 1200 comprises four LC VCO elements 1210, 1212, 1214, 1216, individually designated as VCO1, VCO2, VCO3, VCO4 respectively for ease of reference. Each LC VCO element comprises an inductor 1201, a main varactor 1202, a capacitor 1203, a driver 1204 and a fine tuning varactor 1205. The LC VCO elements 1210, 1212, 1214, 1216 are electrically-isolated but summed at their outputs through buffers 1220, similar to the system 500 of FIG. 5. The system 1200 of FIG. 12 also includes multiplexers 1222 and 1224 for selectably providing the outputs of the LC VCO elements 1210, 1212, 1214, 1216 to a swing comparator 1250, similar to the system 500 of FIG. 5.

The system 1200 of FIG. 12 differs from the system 500 of FIG. 5 in that the outputs of the LC VCO elements 1210, 1212, 1214, 1216 are provided to output buffers 1211, 1213, 1215 and 1217, respectively. One LC VCO 1210 is designated as a master LC VCO, and the other LC VCOs 1212, 1214, 1216 are designated as slave LC VCOs. A master PLL 1260 is connected to receive the overall output from buffers 1220 and a reference clock signal, to generate a Master VCTRL signal for controlling the capacitance of the main varactors 1202 of all of the LC VCOs 1210, 1212, 1214, 1216. The output buffers 1211, 1213, 1215, 1217 are connected to a plurality of secondary or "slave" PLLs 1262, 1264, 1266 for frequency calibration as discussed below. Each of the master PLL 1260 and secondary PLLs, 1262, 1264, 1266 comprises a phase/frequency detector (PFD) and a low pass filter (LPF) also known as a loop filter.

The system 1200 of FIG. 12 also differs from the system 500 of FIG. 5 in that the LC tanks of the VCO elements in the array are not connected together through interconnection paths, however in the FIG. 12 embodiment, the summation of the signals through the buffers 1220 with shorted outputs still brings the same signal-to-noise ratio (SNR) increase to improve the output phase noise. This is true as long as the VCO phase noise is dominant compared to that of the output buffers. In this case, the signals from N LC VCO elements are fully correlated and have the same amplitude (owing to the swing matching) and the same frequency and phases (owing to the master/slave PLLs), while the noise components from N VCO tanks to the buffers are random and uncorrelated. When signal and noise are combined at the shorted output of the buffers, the noise from N sources averages out in RMS sense and the resulting phase variance (RMS jitter) on the output clock goes down by $N^{0.5}$, while the signal remains the same. The corresponding phase noise improvement is [10× $\log_{10}(N)$] in decibel units (dB). This behavior is irrespective of the buffer type (e.g. current-mode open-drain, or voltage-mode CMOS inverter), as long as the buffer phase noise contribution is insignificant compared to that of the VCOs.

As noted above, the master PLL 1260 drives the common master control voltage (Master VCTRL) node for all LC VCOs 1210, 1212, 1214, 1216. The main varactor 1202 connected to this master VCTRL node is significantly larger than the fine tuning varactor 1205. The master VCTRL node is responsible for the bulk of the VCO frequency tuning, i.e. to compensate for temperature and operating supply voltage variations by tuning the center frequency of the VCO array elements to match that of the reference signal.

The secondary PLLs 1262, 1264, 1266 provide a fine tuning mechanism to maintain phase lock and alignment between the 3 slave VCOs 1212, 1214, 1216 and the master VCO 1210. The slave control voltages generated by these secondary PLLs 1262, 1264, 1266 are provided to the Slave VCTRL inputs (e.g., phase/frequency adjustment inputs) of the respective slave VCOs 1212, 1214, 1216 to control the respective fine tuning varactors 1205. To match the VCO topologies, the master VCO 1210 also has a fine tuning varactor 1205 similar to the ones in the slave VCOs, but the corresponding input is driven by master VCTRL voltage.

The secondary PLLs 1262, 1264, 1266 are designed with a much lower tracking bandwidth (by a factor of 10× or more), compared to that of the master PLL 1260. The secondary PLLs 1262, 1264, 1266 only need to operate quickly enough to track any wander (phase variation at very slow frequency of, for example, under 10 Hz) in the natural oscillation frequency of each VCO in the array. This wander is expected to be a slow process.

The differential buffered outputs of all VCOs (master and slave) are shorted at 1220 so as to get the improved phase noise performance. This arises because as all VCO's frequencies/phases are aligned, random phase fluctuations would add in a root-sum-of-squares (RSS) fashion, whereas oscillation signals add in a linear fashion.

Figure 13:
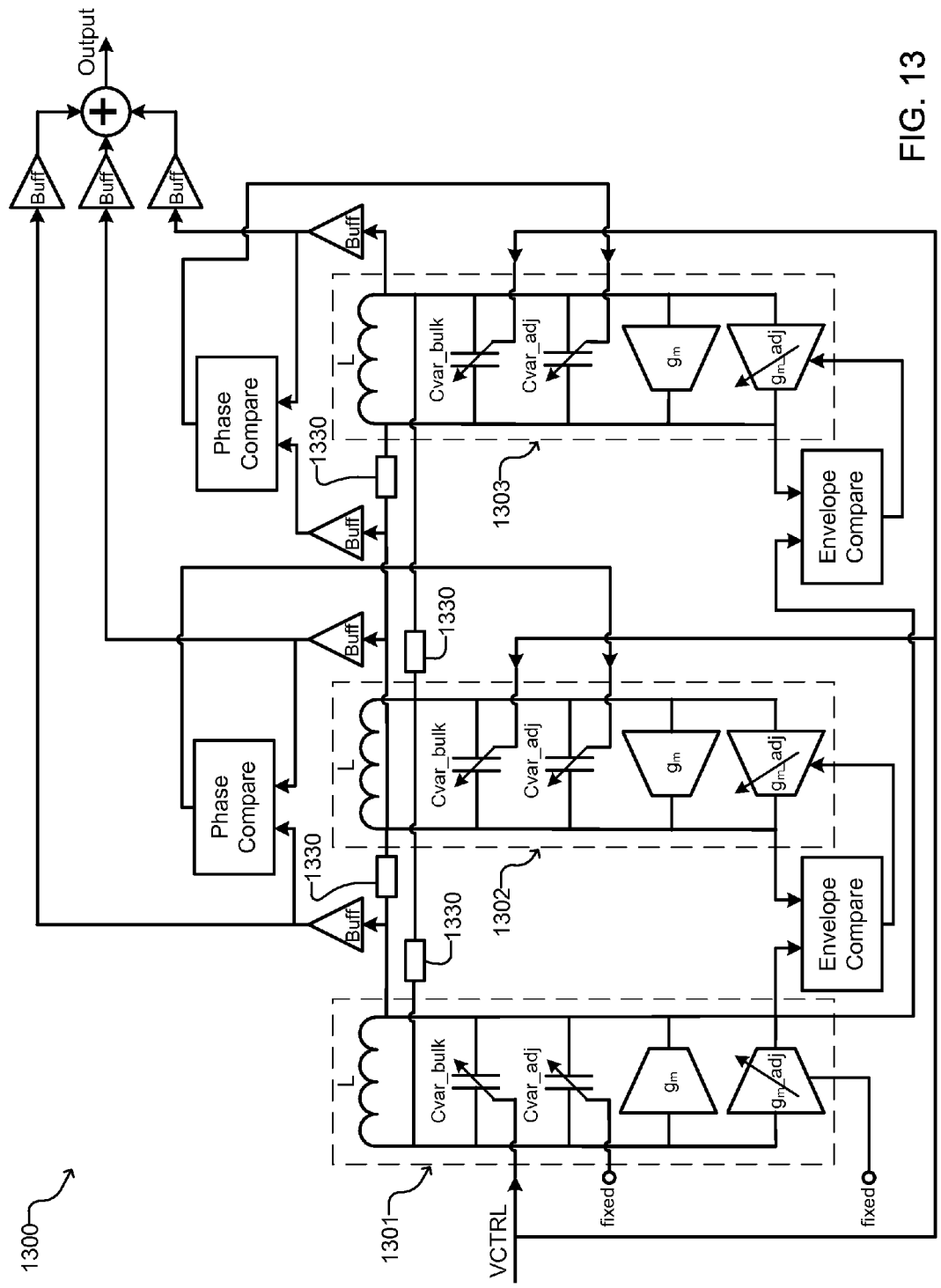
FIG. 13 illustrates a system for reducing mismatch between oscillators in an LC VCO array according to another embodiment of the present disclosure.

FIG. 13 illustrates an example system 1300 for reducing mismatch between oscillators in an LC VCO array according to another embodiment of the present disclosure. The system 1300 reduces mismatch by minimizing the unwanted interconnect current in between a plurality of VCO cores 1301, 1302, 1303. In the embodiment shown in FIG. 13, VCO frequency and amplitude adjustment is achieved through a one-time calibration procedure, as opposed to a continuous operation. Similar to the switchable interconnect elements 530/530A/530B described above, the interconnect impedances 1330 are increased during calibration to make amplitude and frequency differences more pronounced among the VCO cores 1301, 1302, 1303, and decreased during normal functional operation to assure phase alignment among the VCO cores 1301, 1302, 1303. In an example implementation, the structures as shown in FIG. 13 can be bench-characterized once at the start-up to account for existing circuit mismatches (offsets). Embodiments such as shown in FIG. 13 are suitable for implementation in a scenario where physical size of the VCO array is sufficiently large, and/or predictability of the LC VCO mismatches is problematic, leading to uncertainty about the magnitude of unwanted current flow through the interconnection paths between the VCO cores 1301, 1302, 1303.

In the example embodiment shown in FIG. 13, three VCO cores are shown, but it is to be understood that the system 1300 could be expanded to any number N of parallel LC VCO tanks. Where N parallel LC VCO tanks are used, the tank Q remains the same, phase noise decreases, ideally by [10× $\log_{10}(N)$] dB, and power is increased by N times.

According to embodiments of the present disclosure, one or more of the following characteristics are provided:

1) Phase noise performance of 4 VCOs, 8 VCOs, or 12 VCOs in the array exhibits 6 dB, 9 dB, or 12 dB improvement, respectively, over a single VCO. Simulations, assuming ideal matching, have confirmed such improvement.

2) Even with real mismatches amongst the VCOs in the array, once the proposed scheme in this disclosure is applied to minimize frequency and amplitude mismatches in the array, the achieved phase noise improvement is within 0.2-0.3 dB of the expected [10×$\log_{10}(N)$] dB prediction. This has been verified by circuit-level simulations and example integrated circuit implementations in deep submicron CMOS.

Certain embodiments of the present disclosure provide an array VCO with integrated circuitry configured to mitigate mismatch that is easier to layout, uses less layout area on the semiconductor die, and requires less development time to create when compared to other known approaches. This results in lower cost for the IC development and manufacturing. With mismatches mitigated, a better phase noise performance is achieved, and the upper limit of the practical number of VCOs implemented in the array is raised.

Embodiments of the present disclosure are applicable to low-phase-noise clock synthesizers, for example including an integrated jitter attenuator, as well as other RFIC products with very high-end VCO requirements.

For example, an LO module for a receiver (RX) GSM base station can use a 16× array of LC VCOs according to an embodiment of the present disclosure in deep submicron CMOS. In some implementations, a 16×VCO array, using the techniques described herein, could provide about 12 dB phase noise improvement and other benefits with respect to cost, area, and/or power, as explained above.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An apparatus comprising:
a plurality of LC-based voltage-controlled oscillators (LC VCOs) connected in parallel to a common control input, each LC VCO having an output for outputting an oscillating signal based on the common control input, and a frequency/phase adjustment input;
an averaging circuit connected to the output of each LC VCO to generate a common output comprising an average of the outputs of the plurality of LC VCOs;
a frequency comparator connected to the output of each LC VCO to determine a frequency mismatch between one or more of the LC VCOs, and connected to the frequency/phase adjustment inputs of the LC VCO to electronically adjust a capacitance or an inductance of one or more of the LC VCOs to reduce the frequency mismatch.

2. The apparatus of claim 1 wherein each LC VCO has a swing adjustment input, the apparatus comprising a swing comparator connected to the output of each LC VCO to determine a swing mismatch between one or more of the LC VCOs, and connected to the swing adjustment inputs of the LC VCO to adjust a swing of one or more of the LC VCOs to reduce the swing mismatch.

3. The apparatus of claim 1 comprising an interconnection path having a plurality of interconnect elements connecting the outputs of the plurality of LC VCOs, with one interconnect element connected between each pair of adjacent outputs.

4. The apparatus of claim 1 comprising interconnection paths having a plurality of interconnect elements along two parallel paths connecting corresponding polarity nodes of each of the outputs of the plurality of LC VCOs, with one interconnect element connected between each pair of adjacent output nodes.

5. The apparatus of claim 4 wherein the interconnect elements each have an adjustable impedance which is increased during a calibration mode and decreased during a functional mode.

6. The apparatus of claim 1 wherein each LC VCO comprises a first variable capacitance controlled by the common control input, and a second variable capacitance controlled by the frequency/phase adjustment input.

7. The apparatus of claim 2 wherein each LC VCO comprises a bias current source connected between a VCO core and a ground or power rail, wherein the bias current source is connected to be controlled by the swing adjustment input.

8. The apparatus of claim 2 wherein each LC VCO comprises a variable resistance connected between a VCO core and a ground or power rail, wherein the variable resistance is connected to be controlled by the swing adjustment input.

9. The apparatus of claim 2 wherein each LC VCO comprises a parallel transistor array connected between a VCO core and a ground or power rail, wherein the parallel transistor array is connected to be controlled by the swing adjustment input.

10. The apparatus of claim 1 wherein the frequency comparator comprises a frequency comparator circuit, and wherein the output of each LC VCO is connected to the frequency comparator circuit through a first multiplexer and a second multiplexer.

11. The apparatus of claim 1 wherein:
one of the plurality of LC VCOs is a master LC VCO and each of the other of the plurality of LC VCOs is a slave LC VCO;
the common output and a reference clock signal are provided to a master phase locked loop (PLL) to provide a master control signal to the common control input; and
the frequency comparator comprises a plurality of slave PLLs, each slave PLL connected to receive a buffered output from the master LC VCO and a buffered output from a respective slave LC VCO to provide a low-pass-filtered frequency mismatch output signal to the frequency/phase adjustment input of the respective slave LC VCO.

* * * * *